United States Patent
Wang et al.

(10) Patent No.: US 10,748,615 B2
(45) Date of Patent: Aug. 18, 2020

(54) POLARITY-CONDITIONED MEMORY CELL WRITE OPERATIONS

(71) Applicant: Micron Technology, Inc., Boise, ID (US)

(72) Inventors: Hongmei Wang, Boise, ID (US); Luca Crespi, Busto Arsizio (IT); Debayan Mahalanabis, Boise, ID (US); Fabio Pellizzer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/419,831

(22) Filed: May 22, 2019

(65) Prior Publication Data

US 2019/0311768 A1    Oct. 10, 2019

Related U.S. Application Data

(63) Continuation of application No. 15/857,188, filed on Dec. 28, 2017, now Pat. No. 10,354,729.

(51) Int. Cl.
*G11C 13/00*    (2006.01)

(52) U.S. Cl.
CPC ...... *G11C 13/0069* (2013.01); *G11C 13/0004* (2013.01); *G11C 13/0038* (2013.01); *G11C 13/004* (2013.01); *G11C 13/0026* (2013.01); *G11C 13/0028* (2013.01); *G11C 2013/0073* (2013.01); *G11C 2013/0076* (2013.01)

(58) Field of Classification Search
CPC ............... G11C 2013/0073; G11C 2013/0076
USPC ..................................................... 365/163
See application file for complete search history.

(56) References Cited

U.S. PATENT DOCUMENTS

| | | | |
|---|---|---|---|
| 7,369,431 B2 | 5/2008 | Muraoka et al. | |
| 7,443,721 B2 | 10/2008 | Kurotsuchi et al. | |
| 8,107,283 B2* | 1/2012 | Chen | G11C 11/5678 365/148 |
| 8,355,271 B2 | 1/2013 | Rabkin et al. | |
| 8,462,580 B2 | 6/2013 | Rabkin et al. | |
| 8,848,421 B2 | 9/2014 | Kawai et al. | |
| 8,958,233 B2* | 2/2015 | Chen | G11C 11/00 365/148 |
| 9,378,817 B2 | 6/2016 | Kawai et al. | |

(Continued)

OTHER PUBLICATIONS

ISA/KR, International Search Report and Written Opinion of the International Searching Authority, Int'l. Appl. No. PCT/US2018/066001, dated Apr. 2, 2019, Korean Intellectual Property Office, Seo-gu, Daejeon, Republic of Korea, 11 pgs.

*Primary Examiner* — Son L Mai
(74) *Attorney, Agent, or Firm* — Holland & Hart LLP

(57) ABSTRACT

Methods, systems, and devices for polarity-conditioned memory cell write operations are described. A memory cell may be written with a logic state by performing a write operation that includes applying a first write voltage across the memory cell with a first polarity, and applying a second write voltage across the memory cell after applying the first write voltage of the write operation, the second write voltage of the write operation having a second polarity that is different than the first polarity. In some examples, performing a write operation on a memory cell having different voltage polarities across the memory call may allow such a write operation to be completed in a shorter time than a write operation having a voltage of a single polarity.

20 Claims, 12 Drawing Sheets

(56) References Cited

U.S. PATENT DOCUMENTS

| | | | |
|---|---|---|---|
| 9,583,188 B2 | 2/2017 | Takeuchi et al. | |
| 9,613,676 B1 | 4/2017 | Wang et al. | |
| 9,613,694 B1 * | 4/2017 | Li | G11C 13/0069 |
| 9,805,794 B1 | 10/2017 | Li et al. | |
| 9,990,990 B2 | 6/2018 | Fantini et al. | |
| 10,157,670 B2 * | 12/2018 | Pirovano | G11C 13/0004 |
| 2007/0115714 A1 | 5/2007 | Muraoka et al. | |
| 2007/0211512 A1 | 9/2007 | Shuto | |
| 2008/0068873 A1 | 3/2008 | Matsuno et al. | |
| 2011/0176351 A1 | 7/2011 | Fujitsuka et al. | |
| 2014/0085963 A1 | 3/2014 | Schwartz | |
| 2015/0138880 A1 | 5/2015 | Russo et al. | |
| 2017/0125097 A1 | 5/2017 | Tortorelli et al. | |
| 2018/0040370 A1 | 2/2018 | Tortorelli et al. | |
| 2018/0122468 A1 | 5/2018 | Pirovano et al. | |

* cited by examiner

POLARITY-CONDITIONED MEMORY CELL WRITE OPERATIONS

BACKGROUND

The following relates generally to writing a logic state of a memory cell and more specifically to polarity-conditioned memory cell write operations.

Memory devices are widely used to store information in various electronic devices such as computers, wireless communication devices, cameras, digital displays, and the like. Information is stored by programming different states of a memory device. For example, binary devices have two states, often denoted by a logic 1 or a logic 0. In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory such as PCM may maintain a stored logic state for extended periods of time even in the absence of an external power source. Volatile memory such as DRAM may lose a stored state over time unless it is periodically refreshed by an external power source.

Improving memory devices may include increasing memory cell density, increasing read/write speeds, increasing reliability, increasing data retention, reducing power consumption, or reducing manufacturing costs, among other considerations. In some memory devices a particular voltage polarity may be used to perform a write operation on a memory cell. However, write operations on a memory cell consisting of a single voltage polarity across the memory cell may be associated with limited performance.

DETAILED DESCRIPTION

Figure 1:
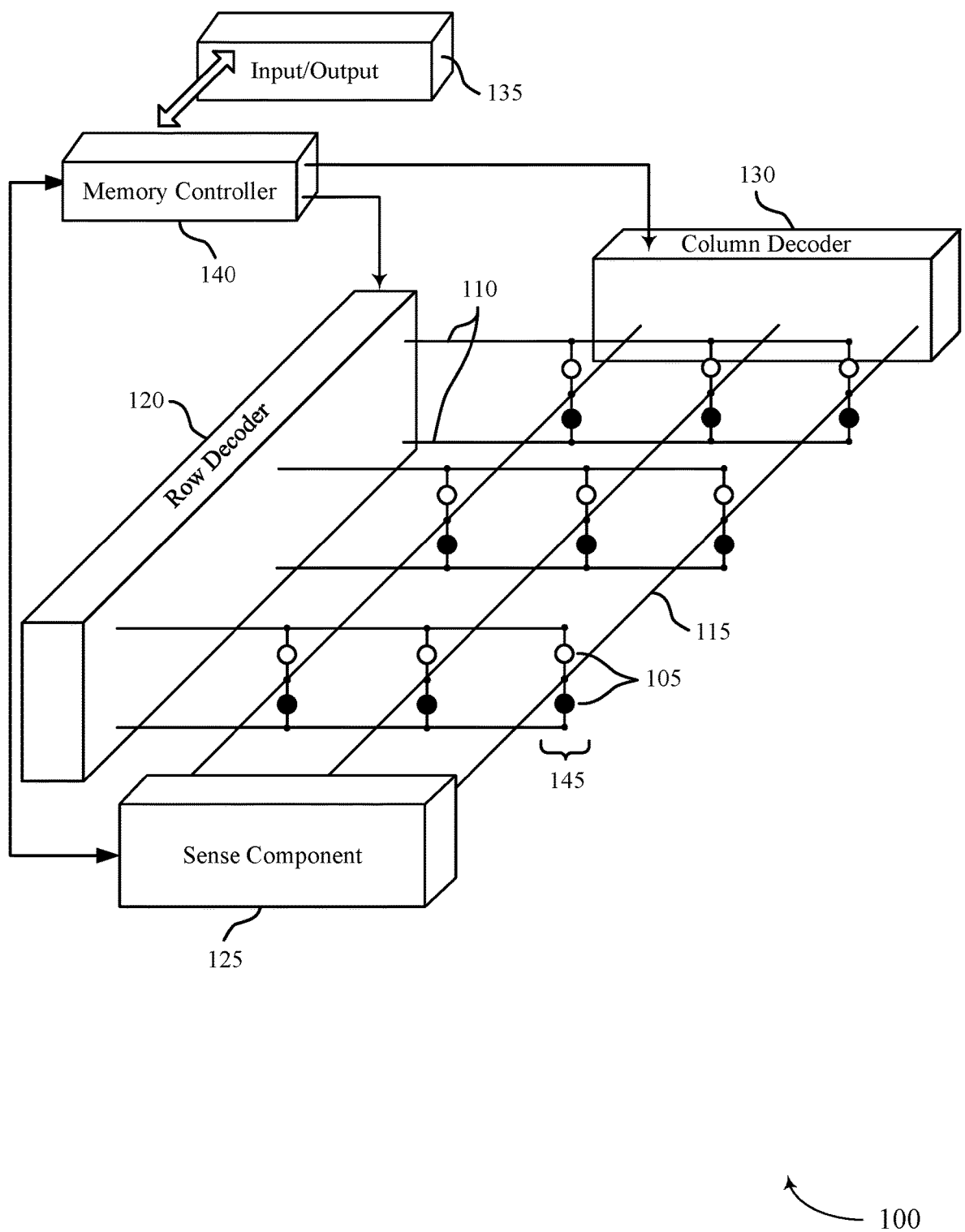
FIG. 1 illustrates an example of a memory array that supports polarity-conditioned memory cell write operations in accordance with examples of the present disclosure.

A memory cell may be written with a logic state by performing a write operation that includes applying write voltages having different polarities across a memory cell in accordance with examples of the present disclosure. Performing a write operation that includes applying voltages having different polarities across a memory cell may improve memory array performance when compared with write operations consisting of a single voltage polarity across the memory cell. For example, applying a voltage across a memory cell may cause a composition segregation across a portion of the memory cell, and such a composition segregation may reduce the rate at which a logic state may be written to the memory cell (e.g., the portion of the memory cell experiencing composition segregation). Applying voltages having different polarities across a memory cell may prevent or reduce such composition segregation in the portion of memory cell. Thus, in some examples, performing a write operation having voltages with different polarities may allow the write operation to be completed faster (e.g., in a shorter duration) than a write operation having a voltage of a single polarity, among other distinct advantages.

In one example, a method may include performing a write operation on a memory cell, which may be coupled with a first access line and a second access line. The method may include applying a first write voltage of the write operation across the memory cell, the first write voltage of the write operation having a first polarity, and applying a second write voltage of the write operation across the memory cell after applying the first write voltage of the write operation, the second write voltage of the write operation having a second polarity that is different than the first polarity. In some examples, applying the first write voltage of the write operation is associated with current flowing through the memory cell in a first direction, and applying the second write voltage is associated with current flowing through the memory cell in a second direction that is different from the first direction. In some examples, the first polarity is opposite from the second polarity. In various examples, applying the first write voltage of the write operation or applying the second write voltage of the write operation includes applying a step change in voltage across the memory cell, a ramped change in voltage across the memory cell, or some other profile of voltage across the memory cell over time.

In some examples, applying the first write voltage of the write operation is associated with forming a more disordered atomic configuration (e.g., an amorphous phase or a more-amorphous composition) of a phase change material of the memory cell, and applying the second write voltage of the write operation is associated with forming a more ordered atomic configuration (e.g., a crystalline phase or a more-crystalline composition) of the phase change material of the memory cell. In some examples, the memory cell may include a memory element comprised of a phase change memory material, such as a chalcogenide material.

Some examples of the write operation may include applying a third write voltage of the write operation across the memory cell before applying the first write voltage of the write operation, the third write voltage of the write operation having the second polarity. In some examples, the second write voltage of the write operation has a lower magnitude than the third write voltage of the write operation. In some examples, applying the third write voltage of the write operation is associated with forming an amorphous phase of a phase change material of the memory cell, and applying the first write voltage of the write operation and applying the second write voltage of the write operation are associated with forming a crystalline phase of the phase change material of the memory cell.

Some examples of the write operation may include applying a fourth write voltage of the write operation across the memory cell, different than the second write voltage of the write operation, after applying the second write voltage of the write operation. The fourth write voltage of the write operation may have the second polarity. In some examples, the second write voltage of the write operation is associated with a nucleation of a crystalline phase of a phase change memory material of the memory cell, and the fourth write voltage is associated with a growth of the crystalline phase of the phase change memory material of the memory cell. Some examples may further include applying a fifth write voltage of the write operation across the memory cell, different than the fourth write voltage of the write operation, after applying the fourth write voltage of the write operation, the fifth write voltage of the write operation having the second polarity. In some examples, the applying the fifth write voltage may be associated with a setback of a crystalline phase of a phase change memory material of the memory cell.

In another example, a method may include identifying a memory cell, determining a logic state to be written to the memory cell, and writing the logic state to the memory cell using a write operation. The write operation may include applying a first write voltage across the memory cell, the first write voltage having a first polarity, applying a second write voltage across the memory cell based at least in part on applying the first write voltage, the second write voltage having a second polarity that is different than the first polarity. In some examples, applying the first write voltage is associated with forming a first material phase of a portion of the memory cell, and applying the second write voltage is associated with forming a second material phase of the portion of the memory cell. Some examples may further include applying a third write voltage across the memory cell before applying the first write voltage, the third write voltage having the second polarity.

Figure 2:
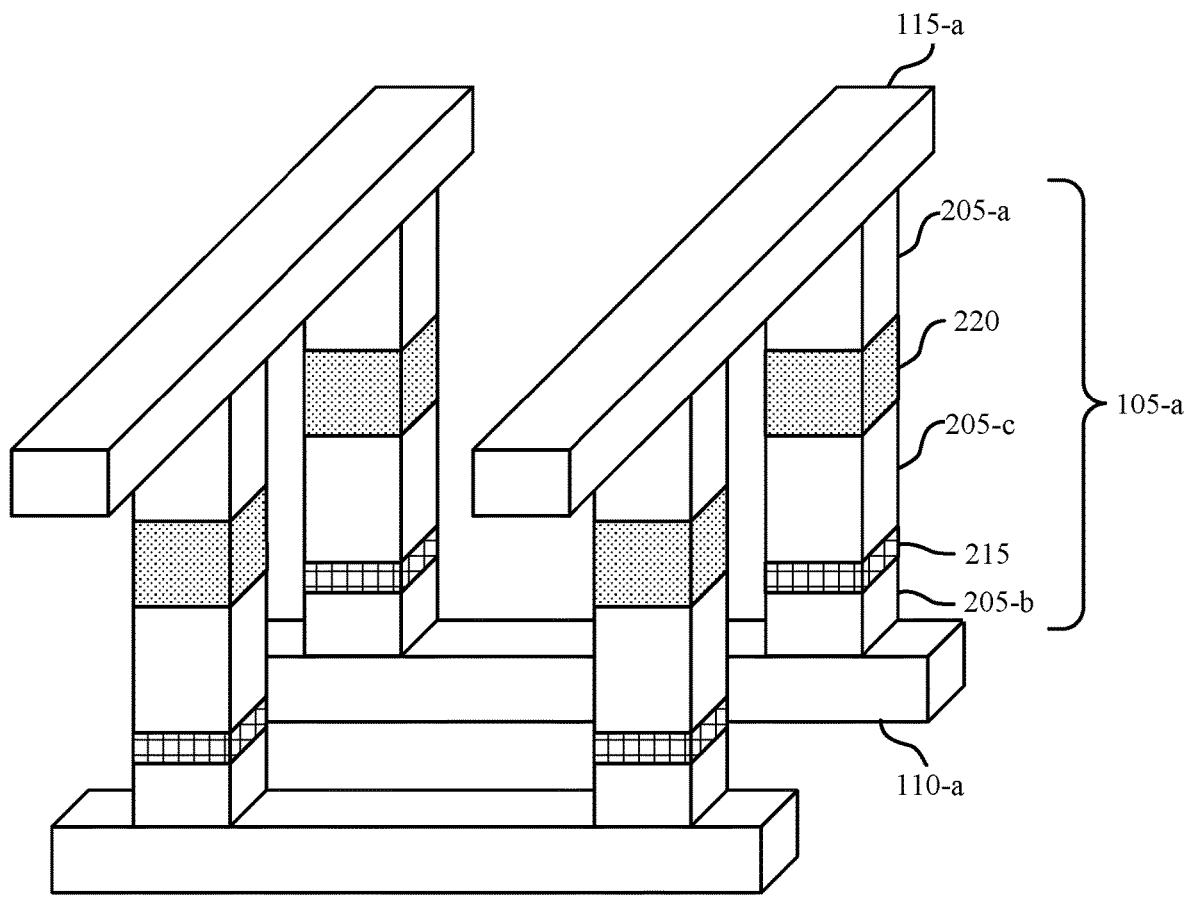
FIG. 2 illustrates an example of a memory array that supports polarity-conditioned memory cell write operations in accordance with examples of the present disclosure.

Features of the disclosure introduced above are further described with respect to FIGS. 1 and 2 in the context of memory arrays that support polarity-conditioned memory cell write operations. Specific examples are then described with respect to FIGS. 3 through 5, which illustrate timing diagrams that support polarity-conditioned memory cell write operations. These and other features of the disclosure are further described with respect to FIGS. 6 through 12, which illustrate apparatus diagrams, system diagrams, and flowcharts that support polarity-conditioned memory cell write operations.

FIG. 1 illustrates an example of a memory array 100 that supports polarity-conditioned memory cell write operations in accordance with various examples of the present disclosure. Memory array 100 may also be referred to as an electronic memory apparatus. Memory array 100 includes memory cells 105 that are programmable to store different logic states. Each memory cell 105 may be programmable to store two logic states, which may be denoted as a logic 0 and a logic 1. In some cases, a memory cell 105 may be configured to store more than two logic states. In some examples, the memory cells 105 may be self-selecting memory (e.g., SSM) cells.

In some examples, a memory cell 105 may store an electric charge representative of the programmable logic states (e.g., storing charge in a capacitor). In one example, a charged and uncharged capacitor may represent two logic states, respectively. In another example, a positively and negatively charged capacitor may represent two logic states, respectively. DRAM or FeRAM architectures may use such designs, and the capacitor employed may include a dielectric material with linear or para-electric electric polarization properties as an insulator. In some examples, a ferroelectric memory cell 105 may include a capacitor with a ferroelectric material as a dielectric material, which may support non-linear polarization properties. In some examples, different levels of charge of a capacitor may represent different logic states (e.g., supporting more than two logic states in a respective memory cell 105).

In some examples, a memory cell 105 may include a material portion, which may be referred to as a memory element, a memory storage element, a self-selecting memory element, or a self-selecting memory storage element, that has a variable and configurable electrical resistance representative of different logic states. For example, a material that can take the form of a crystalline atomic configuration or an amorphous atomic configuration (e.g., able to maintain either a crystalline state or an amorphous state over an ambient operating temperature range of the memory array 100) may have different electrical resistances depending on the atomic configuration. A more-crystalline state of the material (e.g., a single crystal, or a collection of a relatively large crystal grains that is substantially crystalline) may have a relatively low electrical resistance, and may alternatively be referred to as a "SET" logic state. A more-amorphous state of the material (e.g., an entirely amorphous state, or some distribution of relatively small crystal grains that is substantially amorphous) may have a relatively high electrical resistance, and may alternatively be referred to as a "RESET" logic state. Thus, a voltage applied to such a memory cell 105 may result in different current flow depending on whether the material portion of the memory cell 105 is in the more-crystalline or the more-amorphous state. Accordingly, the magnitude of the current resulting from applying a read voltage to the memory cell 105 may be used to determine a logic state stored by memory cell 105.

In some examples, a memory element may be configured with various ratios of crystalline and amorphous areas (e.g., varying degrees of atomic order and disorder) that may result in intermediate resistances, which may represent different logic states (e.g., supporting more than two logic states in a respective memory cell 105). Further, in some examples, a material or a memory element may have more than two atomic configurations, such as an amorphous configuration and two different crystalline configurations. Although described herein with reference to an electrical resistance of different atomic configurations, a memory device may use some other characteristic of a memory element to determine a stored logic state corresponding to an atomic configuration, or combination of atomic configurations.

In some cases, a memory element in a more-amorphous state may be associated with a threshold voltage, where electrical current flows through the memory element when the threshold voltage is exceed across the memory element. When a voltage applied across the memory element in the more-amorphous state is less than the threshold voltage, current may not flow through the memory element. In some cases, a memory element in the more-crystalline state may not be associated with a threshold voltage (e.g., may be associated with a threshold voltage of zero), and a current may flow through the memory element in response to a non-zero voltage across the memory element. In some cases, a material in both the more-amorphous state and the more-crystalline state may be associated with threshold voltages. For example, SSM may enhance differences in a threshold voltage of the memory cell between different programmed states (e.g., by way of different compositional distributions). As discussed in further detail below, the logic state of a memory cell 105 having such a memory element may be set by heating the memory element to a temperature profile over time that supports forming a particular atomic configuration, or combination of atomic configurations.

Memory array 100 may be a three-dimensional (3D) memory array, where two-dimensional (2D) memory layers (e.g., "levels") are formed on top of one another. Such an arrangement of layers may increase the number of memory cells 105 that may be formed on a single die or substrate as compared with 2D arrays, which in turn may reduce production costs, or increase the performance of the memory array, or both. According to the example depicted in FIG. 1, memory array 100 includes two levels of memory cells 105 and may thus be considered a 3D memory array. Other examples or a memory array 100 in accordance with the present disclosure may have a single layer, or more than two layers. In some examples, each level may be aligned or positioned so that memory cells 105 may be approximately aligned with one another across levels, forming a memory cell stack 145.

In the example of memory array 100, each row of memory cells 105 is connected to one of a plurality of first access lines 110 (e.g., a word line), and each column of memory cells 105 is connected to one of a second plurality of access lines 115 (e.g., a bit line). Access lines 110 and 115 may be substantially perpendicular to one another to create an array of access lines. As shown in FIG. 1, the two memory cells 105 in a memory cell stack 145 may be accessed by separate access lines 110, and share a common access line 115. That is, an access line 115 may be coupled with (e.g., in electronic communication with) the bottom electrode of the upper memory cell 105-a and the top electrode of the lower memory cell 105-b. Other configurations may be possible. For example, a third layer may share an access line 110 with a lower layer.

In general, one memory cell 105 may be located at the intersection (e.g., coupled between) an access line 110 and an access line 115. This intersection may be referred to as an address of a memory cell 105. A target memory cell 105 may be a memory cell 105 located at the intersection of an energized access line 110 and an energized access line 115. In other words, an access line 110 and an access line 115 may be energized or otherwise selected in order to read or write a memory cell 105 at their intersection. Other memory cells 105 that are in electronic communication with (e.g., connected to) the same access line 110 or 115 may be referred to as untargeted memory cells 105.

In some examples, an electrode may be coupled with (e.g., between) a memory cell 105 and an access line 110, or with (e.g., between) a memory cell 105 and an access line 115. The term electrode may refer to an electrical conductor, or other electrical interface between components, and in some cases, may be employed as an electrical contact to a memory cell 105. An electrode may include a trace, wire, conductive line, conductive layer, conductive pad, or the like, that provides a conductive path between elements or components of memory array 100.

Operations such as reading and writing may be performed on memory cells 105 by activating or otherwise selecting access lines 110 and 115. References to word lines, bit lines, digit lines, or their analogues are interchangeable without loss of understanding or operation. Activating or selecting an access line 110 or an access line 115 may include applying a voltage to the respective access line. Access lines 110 and access lines 115 may be made of conductive materials such as metals (e.g., copper (Cu), aluminum (Al), gold (Au), tungsten (W), etc.), metal alloys, carbon, conductively-doped semiconductors, or other conductive materials, alloys, compounds, or the like.

In some architectures, the logic storing portion of a cell (e.g., a capacitor or resistive memory element) may be electrically isolated from an access line by a selection component. For example, an access line 110 may be connected to and may control such a selection component (e.g., a selection component of a memory cell 105). In some examples, a selection component may be a transistor and an access line 110 may be connected to the gate of the transistor. Activating the access line 110 may therefore cause an electrical connection or closed circuit between the logic storing portion of a memory cell 105 and its corresponding access line 115. The access line 115 may then be accessed to either read or write the memory cell 105. After selecting a memory cell 105, the resulting signal may be used to determine the logic state stored by the memory cell 105. For example, a voltage may be applied across the memory cell 105 and the resulting current may be used to differentiate between atomic configurations (e.g., resistive states) of a phase change material of the memory cell 105. In some cases, a first logic state may correspond to no current or a negligibly small current, whereas a second logic state may correspond to some finite current.

Accessing memory cells 105 may be controlled through a row decoder 120 and a column decoder 130. For example, a row decoder 120 may receive a row address from the memory controller 140 and activate or otherwise select the appropriate access line 110 based on the received row address. Similarly, a column decoder 130 may receive a column address from the memory controller 140 and activate or otherwise select the appropriate access line 115.

The memory controller 140 may control the operation (e.g., read operations, write operations, rewrite operations, refresh operations, or discharge operations) of memory cells 105 through the various components (e.g. row decoder 120, column decoder 130, and sense component 125). In some cases, one or more of the row decoder 120, column decoder 130, and sense component 125 may be co-located with the memory controller 140. Memory controller 140 may generate row and column address signals in order to activate the desired access line 110 and access line 115. Memory controller 140 may also generate or control various voltages or currents used during the operation of memory array 100. For example, the memory controller 140 may apply a discharge voltage to a access line 110 or access line 115 after accessing one or more memory cells 105.

In general, the amplitude, shape, or duration of an applied voltage, current, or charge in accordance with the present disclosure may be adjusted or varied, and may be different for the various operations discussed in operating the memory array 100. Further, one, multiple, or all memory cells 105 within memory array 100 may be accessed simultaneously. For example, multiple or all memory cells 105 of memory array 100 may be accessed simultaneously during a reset operation in which all memory cells 105, or a group of memory cells 105, are set to a single logic state.

A memory cell 105 may be read (e.g., sensed) by sense component 125 when the memory cell 105 is accessed to determine the stored state of the memory cell 105. For example, after accessing the memory cell 105, the logic storage portion of memory cell 105 may discharge, or otherwise permit current to flow via its corresponding access line 115. Such current may result from biasing, or applying a voltage, to the memory cell 105 from one or more voltage sources (not shown) of the memory array 100, where such voltage sources may be part of the sense component 125, the memory controller 140, or some other component (e.g., a biasing component). In some examples, a discharge of a memory cell 105 may cause a change in the voltage of the access line 115, which the sense component 125 may compare to a reference voltage in order to determine the stored state of the memory cell 105. In some examples, a voltage may be applied to a memory cell 105 (e.g., using the corresponding access line 110 and access line 115) and the presence of a resulting current may depend on the applied voltage and the resistance state of a memory element of the memory cell 105.

In some cases, more than one voltage may be applied when reading a memory cell 105 (e.g., multiple voltages of a read operation). For example, if an applied read voltage does not result in current flow, other read voltages may be applied until a current is detected by sense component 125. By assessing the read voltage that resulted in current flow, the stored logic state of the memory cell 105 may be determined. In some cases, a read voltage may be ramped higher in magnitude until a current flow is detected by sense component 125. In other cases, predetermined read voltages may be applied sequentially until a current is detected. Likewise, a read current may be applied to a memory cell 105 and the magnitude of the voltage to create the read current may depend on the electrical resistance or the total threshold voltage of the memory cell 105.

Sense component 125 may include various transistors or amplifiers in order to detect and amplify a difference in read signals (e.g., a read voltage, a read current, or a read charge shared between components of the memory array 100), which, in some examples, may be referred to as latching. The sense component 125 may be configured to sense the current or charge through the memory cell 105 responsive to a read operation and provide an output signal indicative of the logic state stored by the memory cell 105. The sense component 125 may be included in a memory device that includes the memory array 100. For example, the sense component 125 may be included with other read and write circuits, decoding circuits, or register circuits of the memory that may be coupled to the memory array 100. In some examples, the detected logic state of memory cell 105 may be output through column decoder 130 as output 135. In some examples, a sense component 125 may be part of a column decoder 130 or row decoder 120. In some examples, a sense component 125 may be connected to or otherwise in electronic communication with column decoder 130 or row decoder 120.

In some examples, when a read pulse (e.g., a read voltage) is applied across a memory cell 105 with a memory element storing a first logic state (e.g., a SET state, associated with a more-crystalline atomic configuration), the memory cell conducts current due to the read pulse exceeding a threshold voltage of the memory cell 105. In response or based on this, the sense component 125 may therefore detect a current through the memory cell 105 as part of determining the stored logic state. When a read pulse is applied to the memory cell 105 with the memory element storing a second logic state (e.g., a RESET state, associated with an more-amorphous atomic configuration), which may occur before or after the application of a read pulse across a memory cell 105 with a memory element storing a first logic state, the memory cell may not conduct current due to the read pulse not exceeding the threshold voltage of the memory cell. The sense component 125 may therefore detect little or no current through the memory cell 105 as part of determining the stored logic state.

In some examples, a threshold current may be defined for sensing the logic state stored by a memory cell 105. The threshold current may be set above a current that may pass through the memory cell 105 when the memory cell 105 does not threshold in response to the read pulse, but equal to or below an expected current through the memory cell 105 when the memory cell 105 does threshold in response to the read pulse. For example, the threshold current may be higher than a leakage current of the associated access lines 110 or 115. In some examples, a logic state stored by a memory cell 105 may be determined based on a voltage (e.g., across a shunt resistance) resulting from the current driven by a read pulse. For example, the resulting voltage may be compared relative to a reference voltage, with a resulting voltage less than the reference voltage corresponding to a first logic state and a resulting voltage greater than the reference voltage corresponding to a second logic state.

In some memory architectures, accessing the memory cell 105 may degrade or destroy the stored logic state and re-write or refresh operations may be performed to return the original logic state to memory cell 105. In DRAM or FeRAM, for example, a capacitor of a memory cell 105 may be partially or completely discharged during a sense operation, thereby corrupting the stored logic state. In PCM, for example, sense operations may cause a change in the atomic configuration of a memory cell 105, thereby changing the resistance state of the memory cell 105. Thus, in some examples, the logic state stored in a memory cell 105 may be rewritten after an access operation. Further, activating a single access line 110 or 115 may result in the discharge of all memory cells 105 coupled with the access line 110 or 115. Thus, several or all memory cells 105 coupled with an access line 110 or 115 of an access operation (e.g., all cells of an accessed row or all cells of an accessed column) may be rewritten after the access operation.

In some examples, reading a memory cell 105 may be non-destructive. That is, the logic state of the memory cell 105 may not need to be rewritten after the memory cell 105 is read. For example, in non-volatile memory such as PCM, accessing the memory cell 105 may not destroy the logic state and, thus, the memory cell 105 may not require rewriting after accessing. However, in various examples, refreshing the logic state of the memory cell 105 may or may not be needed in the absence of access operations. For example, the logic state stored by a memory cell 105 may be refreshed at periodic intervals by applying an appropriate write or refresh pulse in order to maintain the stored logic state. Refreshing the memory cell 105 may reduce or eliminate read disturb errors or logic state corruption due to a charge leakage or a change in an atomic configuration of a memory element over time.

A memory cell 105 may be written with a logic state by activating or otherwise selecting the relevant access lines (e.g., an access line 110 and an access line 115). In other words, a logic value may be stored in the memory cell 105 by a write operation via an access line 110 and an access line 115 corresponding to the memory cell 105. Column decoder 130 or row decoder 120 may accept data (e.g., via input/output 135) to be written to the memory cells 105. In the case of PCM, a memory cell 105 may be written by heating the memory element of a memory cell 105 by passing a current through the memory element. The voltages used to apply a current to a memory cell 105 may depend on the various threshold voltages of the memory elements, and in some cases, a threshold voltage associated with a selection component.

In some cases, more than one voltage may be applied when writing a memory cell 105 with a logic state. For example, when writing a memory element having different atomic configurations associated with different logic states, write voltages may be applied such that heating caused by the related current flowing through the memory cell causes a transition from one atomic configuration to another. In one example, to write a logic state associated with a more-crystalline atomic configuration, a first write voltage of the write operation may be associated with initially forming a disordered atomic configuration (e.g., providing a high enough temperature to generally "melt" the material to a relatively random, and sometimes unstable atomic distribution), and a second write voltage of the write operation may be associated with forming a more-crystalline atomic configuration (e.g., providing a relatively moderate temperature that supports the nucleation and growth of a stable form of the relatively ordered atomic configuration).

To program a memory cell 105 with an SSM element, programming pulses (e.g., a write pulse, a write signal, a write current, or a write voltage) of different polarities may be applied across the memory cell 105. For example, to program a logic 1 state a voltage having a first polarity may be applied across the memory cell 105, and to program a logic 0 state a voltage having a second polarity (e.g., a different polarity) may be applied across the memory cell 105. In some cases, the first polarity and the second polarity may be opposite polarities across the memory cell 105.

In some examples, a threshold voltage of a memory cell 105 (e.g., a memory cell with an SSM storage element) may depend on a polarity used to program (e.g., write) the memory cell 105 with a particular logic state. For example, when a memory cell 105 is programmed with a voltage across the memory cell 105, elements within the memory cell 105 may separate along the direction of applied voltage polarity, causing compositional segregation (e.g., ion migration). Ions may migrate towards a particular electrode of the memory cell 105 depending on the polarity and composition. For example, in a memory cell 105 having an SSM element, some ions may migrate towards a negative electrode of the memory cell 105. In one example of a memory cell 105 having an SSM element, crowding of selenium and arsenic ions at a portion of the SSM element may affect the conduction properties, and thus the threshold voltage of the memory cell 105.

To read a memory cell 105 with an SSM storage element, a voltage may be applied across memory cell 105 and the resulting current, or the threshold voltage at which current begins to flow, may be representative of a particular logic state. In some examples, reading a memory cell 105 may support sensing which electrode ions have migrated towards. For example, a memory cell 105 with an SSM element that has been programmed with one polarity may have certain resistive properties and thus one threshold voltage. The same memory cell 105 with the SSM element may be programmed with a different polarity that may result in different resistive properties of the cell and thus a different threshold voltage.

A logic state may be written to a memory cell 105 by applying a write voltage to one or both of an associated access line 110 or access line 115. For example, a logic state may be written to a memory cell 105 by applying a write voltage having a first polarity across the memory cell 105 (e.g., a positive polarity). To apply a write voltage having a positive polarity, a first voltage (e.g., a positive voltage) may be applied to the associated access line 115, and the associated access line 110 may be grounded or have an otherwise comparatively lower or negative voltage. In other examples, a logic state may be written to a memory cell 105 by applying a write voltage having a different polarity across the memory cell 105, such as a negative polarity. To apply a write voltage with a negative polarity, a second voltage (e.g., a positive voltage) may be applied to the access line 110 and the access line 115 may be grounded or have an otherwise comparatively lower or negative voltage. After writing the memory cell 105, subsequent read voltages may be applied to read the stored state of memory cell 105.

In accordance with examples of the present disclosure, a write operation may be divided into different portions having different voltage polarities across a memory cell 105. In some examples, a logic state may be written to a memory cell 105 by performing a write operation that includes applying a first write voltage (e.g., a first write signal portion) having a first polarity across the memory cell 105 and applying a second write voltage (e.g., a second write signal portion) having a second polarity (e.g., that is different from the first polarity, such as an opposite polarity) across the memory cell 105.

In some examples, such a write operation may include applying multiple write voltages across the memory cell 105 through a corresponding access line 110 and a corresponding access line 115 by switching the polarity of voltage application between the access line 110 and the access line 115 during the write operation. In one example, a write operation may include applying a first write voltage with a voltage at the access line 110 being higher than a voltage at the access line 115 followed by applying a second write voltage with a voltage at the access line 110 being lower than a voltage at the access line 115. In another example, a write operation in accordance with the present disclosure may include applying a first write voltage with a voltage at the access line 110 being lower than a voltage at the access line 115 followed by applying a second write voltage with a voltage at the access line 110 being higher than a voltage at the access line 115.

Performing a write operation on a memory cell 105 that includes applying at least two write voltages having opposite polarities across the memory cell 105, or otherwise different polarities across the memory cell 105, may support a reduced composition segregation across the memory cell 105 as compared with a write operation that includes only write voltages of a same polarity across the memory cell. In some examples, performing a write operation on a memory cell 105 that includes applying different polarities across the memory cell 105 may enable a faster write operation than a write operation that includes only write voltages of a same polarity, among other distinct advantages.

In some examples, consecutive write operations may be performed on a memory cell 105 with different polarities across the memory cell 105. For example, a first write operation may include writing a first logic state to the memory cell 105 with a first polarity. A second write operation may include writing a second logic state to the memory cell 105, which may be the same as or different from the first logic state, with a second polarity that is different from the first polarity (e.g., opposite from the first polarity). The second polarity for the second write operation may be determined (e.g., by a memory controller) based at least in part on identifying the first polarity (e.g., determining the polarity of the preceding write operation). In various examples, the first and second write operations may or may not be separated by one or more read operations, or other access operations. Moreover, one or both of the first write operation or the second write operation may each include applying two or more voltages having different polarities, as described herein. In such examples, the first write operation may be referred to as one of a forward or reverse write operation, and the second write operation may be referred to as the other of the forward or reverse write operation.

Performing consecutive write operations on a memory cell 105 having opposite polarities across the memory cell 105, or otherwise different polarities across the memory cell 105, may also support a reduced composition segregation across the memory cell 105 as compared with consecutive write operations that apply the same polarity across the memory cell 105. In some examples, performing consecutive write operations on a memory cell 105 having different polarities across the memory cell 105 may enable faster write operations than consecutive write operations that includes write voltages of a same polarity, among other distinct advantages.

After performing a write operation on a memory cell 105 (e.g., a write operation with one or more voltages applied with a single polarity across the memory cell 105, or a write operation with one or more voltages applied with more than one polarity across the memory cell 105), a read operation may be performed to read the stored state of memory cell 105. In some examples, a read operation may include applying different read voltages having different polarities across the memory cell 105. In some examples, the memory cell 105 may be read by applying a first read voltage having a first polarity across the memory cell 105, which may be a positive or negative polarity.

In some examples, the first read voltage may have a magnitude that is less than a write voltage of a preceding write operation. After applying the first read voltage, the read operation may further include applying a second read voltage having a second polarity across the memory cell 105, different from the first polarity. The second polarity may be an opposite polarity, or an otherwise different polarity than the first polarity. Thus, in some examples, the first polarity may be a positive polarity across the memory cell 105 may be a positive polarity and the second polarity may be a negative polarity. In other examples, the first polarity across the memory cell 105 may be a negative polarity and the second polarity may be a positive polarity. Performing a read operation on a memory cell 105 that includes applying at least two read voltages having opposite polarities across the memory cell 105, or otherwise different polarities across the memory cell 105, may support a reduced composition segregation across the memory cell 105 as compared with a read operation that includes only read voltages of a same polarity across the memory cell.

In some examples, the memory controller 140 may be operable to apply the read and write voltages as described above (e.g., by enabling access lines 110 or 115, or otherwise coupling one or more voltage sources with the memory cell 105). For example, memory controller 140 may be operable to perform a write operation including write voltages of differing polarities. Stated alternatively, the memory controller 140 may be operable to first apply a first write voltage having a first polarity across the memory cell 105, and subsequently apply a second write voltage having a second polarity (e.g., opposite from the first polarity) across the memory cell 105 after applying the first write voltage.

In some examples the memory controller 140 may be configured to store, or otherwise identify a polarity of preceding read or write operations (e.g., for one or more memory cells 105). In some examples the memory controller 140 may be configured to determine a polarity for a write operation based at least in part on a stored or otherwise identified polarity from a preceding read or write operation. For example, the memory controller 140 may determine a polarity for a write operation on a memory cell 105 based at least in part on a stored or otherwise identified polarity from a preceding read or write operation on the same memory cell 105.

In some examples, the memory controller 140 may be operable to perform a read operation including read voltages of differing polarities. Stated alternatively, the memory controller 140 may be operable to first apply a first read voltage having a first polarity across the memory cell 105, and subsequently apply a second read voltage having a second polarity (e.g., opposite from the first polarity) across the memory cell 105 after applying the first read voltage. In some examples the memory controller 140 may be configured to determine a polarity for a read operation based at least in part on a stored or otherwise identified polarity from a preceding read or write operation. For example, the memory controller 140 may determine a polarity for a read operation on a memory cell 105 based at least in part on a stored or otherwise identified polarity from a preceding read or write operation on the same memory cell 105. The application of the read voltages of different polarities by the memory controller 140 may facilitate the sense component 125 determining a logic state of the memory cell 105 based at least in part on the application of the voltages of different polarities. In some examples, the memory controller 140 may activate, or send an indication to, sense component 125 to determine the logic state of the memory cell 105.

In various examples in accordance with the present disclosure, different access lines or different voltage sources may be used to support read or write operation having different voltage polarities. For example, a third access line (not shown) may be coupled to the memory cell 105 such that a first voltage of a read or write operation is applied in a first direction through the memory cell and a second voltage of the read or write operation is applied in a second, different direction (e.g., an orthogonal direction). Accordingly, applying voltages having different polarities across a memory cell in accordance with the present disclosure need not be limited to opposite polarities. Rather, in some examples, applying such voltages may refer more broadly to electric fields being applied to a memory cell 105 in different directions of a 2D or 3D coordinate system, which may or may not be associated with providing an electrical current through the memory cell 105.

FIG. 2 illustrates an example of a memory array 200 that supports polarity-conditioned memory cell write operations in accordance with various examples of the present disclosure. Memory array 200 may be an example of memory array 100 with reference to FIG. 1. Memory array 200 includes a plurality of memory cells (e.g., memory cell 105-*a*), a plurality of access lines 110 (e.g., access line 110-*a*), and a plurality of access lines 110 (e.g., access line 115-*a*), which may be examples of memory cells 105, access lines 110, and access line 115 described with reference to FIG. 1. In some cases, a 3D memory array may be formed by stacking multiple memory arrays 200 on one another. The two stacked arrays may, in some examples, have common conductive lines such that each level may share access lines 110 or access lines 115 as described with reference to FIG. 1.

In the example of memory array 200, memory cell 105-*a* includes a memory element 220 which may be an example of a phase change memory element as described herein.

Memory cell 105-*a* also includes a first electrode 205-*a* (e.g., coupled between the memory element 220 and the access line 115-*a*), which may be referred to as a top electrode, and a second electrode 205-*b* (e.g., coupled between the memory element 220 and the access line 110-*a*), which may be referred to as a bottom electrode. In some examples, the memory cell 105-*a* may also include a selector device 215. In such examples the memory cell 105-*a* may include an electrode 205-*c* (e.g., coupled between the memory element 220 and the selector device 215), which may be referred to as a middle electrode.

In accordance with examples of the present disclosure, a logic state may be stored by the memory cell 105-*a* by configuring the atomic configuration (e.g., the electrical resistance) of memory element 220. In some cases, this configuring may include passing a current associated with a write operation through the memory cell 105-*a* to heat the memory cell 105-*a* (e.g., heating the memory element 220), which may wholly or partially form a different atomic configuration (e.g., forming an amorphous phase, or forming a crystalline phase, or forming a combination of an amorphous and crystalline phase) in the memory element 220.

Memory array 200 may be referred to as a cross-point architecture. It may also be referred to as a pillar structure, where a pillar may be in contact with a first conductive line (e.g., access line 110-*a*) and a second conductive line (e.g., access line 115-*a*). For example, as shown in FIG. 2, a pillar may include the second electrode 205-*b* (e.g., a bottom electrode), the selector device 215, the third electrode 205-*c* (e.g., a middle electrode), the memory element 220, and the first electrode 205-*a* (electrode 205). Such a pillar architecture may offer relatively high-density data storage with lower production costs compared to other memory architectures.

In some examples, a write voltage may be applied across memory cell 105-*a* by applying a voltage to one or both of the access line 110-*a* or the access line 115-*a*. The write voltage may be applied with a positive polarity or a negative polarity across the memory cell 105-*a*. For example, when applying a write voltage with a positive polarity, a positive voltage may be applied to the access line 115-*a* and the access line 110-*a* may be grounded or have a voltage that is otherwise comparatively lower than the positive voltage applied to the access line 115-*a*. When applying a write voltage with a negative polarity, a positive voltage may be applied to the access line 110-*a* and the access line 115-*a* may be grounded or otherwise comparatively lower than the positive voltage applied to the access line 110-*a*.

In some examples, access line 110-*a* and access line 115-*a* may be maintained at a first voltage (e.g., an inhibit voltage that may prevent or otherwise limit memory cell discharge) prior to accessing memory cell 105-*a*. For instance, both the access line 110-*a* and access line 115-*a* may be maintained at an inhibit voltage that is equivalent to a ground or virtual ground (e.g., access line 110-*a* and access line 115-*a* may be coupled with a ground voltage source, or virtual ground voltage source). To access memory cell 105-*a*, one or both of the access line 110-*a* or the access line 115-*a* may be energized by applying an voltage to them, and the resulting voltage applied across a target memory cell 105-*a* may be referred to as a cell access voltage. In some examples, access voltages applied to access line 110-*a* and access line 115-*a* may have opposite polarities as compared to the ground or virtual ground, such that the magnitude of voltages applied to the access line 110-*a* and access line 115-*a* are additive across the memory cell 105-*a*.

In some examples, an inhibit voltage may be an intermediate voltage (e.g., a mid-bias voltage). In some examples, instead of applying a positive access line access voltage and a negative access line access voltage relative to a virtual ground, a voltage may be applied to an access line 110 or 115 relative to such an intermediate voltage. For instance, the memory array 200 may be operated using a positive voltage source (e.g., with reference to ground or virtual ground), and the intermediate voltage may be between the positive voltage source and a ground or virtual ground.

In some examples, voltages applied to an access line 110 or 115 may be maintained at the intermediate voltage prior to an access operation performed on memory cell 105-*a*. During an example access operation, a voltage applied to the access line 115-*a* may be increased (e.g., to a positive supply rail) while a voltage applied to the access line 110-*a* may be decreased (e.g., to a virtual ground), generating a voltage across memory cell 105-*a* (e.g., with a positive polarity).

A selector device 215 may, in some cases, be connected in series between a memory element 220 and a conductive line (e.g., at least one of the access line 110-*a* or the access line 115-*a*). For example, as depicted in memory array 200, the selector device 215 is located between the second electrode 205-*b* (e.g., a bottom electrode) and the third electrode 205-*c* (e.g., a middle electrode). Thus, the selector device 215 is located in series between (e.g., coupled between) the memory element 220 and the access line 110-*a*. Other configurations are possible. For example, a selector device 215 may be located in series between the memory element 220 and the access line 115-*a*. In other examples a selector device 215 may not be part of a memory cell 105, but may otherwise be coupled between a memory cell 105 and an access line (e.g., access line 110 or 115).

A selector device 215 may aid in selecting a particular memory cell 105, or may help prevent stray currents from flowing through non-selected memory cells 105 adjacent a selected memory cell 105. A selector device 215 may also reduce the bias (e.g., voltage) across untargeted memory cells 105. For example, a selector device 215 may have a threshold voltage such that a current flows through selector device 215 when the threshold voltage is met or exceeded.

A selector device 215 may be an electrically non-linear component (e.g., a non-ohmic component) such as a metal-insulator-metal (MIM) junction, an ovonic threshold switch (OTS), or a metal-semiconductor-metal (MSM) switch, among other types of two-terminal selecting components such as a diode. In some cases, a selector device 215 includes a chalcogenide film, for example, an alloy of selenium (Se), arsenic (As), and germanium (Ge). A selector device 215 may be physically separated from a memory element 220 by an electrode such as the third electrode 205-*c*. As such, the third electrode 205-*c* may electrically float—that is, charge may accumulate at the third electrode 205-*c* because it may not be directly connected to an electrical ground or virtual ground, or other component capable of being electrically grounded.

The memory array 200 may be formed by various combinations of material formation and removal (e.g., additive and subtractive operations). For example, layers of material may be deposited that correspond to the access lines 110 or 115, electrodes 205, selector devices 215, or memory elements 220. Material may be selectively removed to then create the desired features, such as the pillar structure depicted in the memory array 200. For example, features may be defined using photolithography to pattern a photoresist and then material may be removed by techniques such as etching. Access lines 115 may then be formed, for example, by depositing a layer of material and selectively etching to form the line structure depicted in the memory array 200. In some cases, electrically insulating regions or layers may be formed or deposited. The electrically insulating regions may include oxide or nitride materials, such as silicon oxide, silicon nitride, or other electrically insulating materials.

Various techniques may be used to form materials or components of the memory array 200. These may include, for example, chemical vapor deposition (CVD), metal-organic chemical vapor deposition (MOCVD), physical vapor deposition (PVD), sputter deposition, atomic layer deposition (ALD), or molecular beam epitaxy (MBE), among other thin film growth techniques. Material may be removed using a number of techniques, which may include, for example, chemical etching (also referred to as "wet etching"), plasma etching (also referred to as "dry etching"), or chemical-mechanical planarization.

As discussed above, memory cells 105 of the memory array 200 may include a memory element 220 associated with a configurable atomic configuration (e.g., a configurable resistance). Materials that support a configurable resistance may include, for example, metal oxides, chalcogenides, and the like. Chalcogenide materials are materials or alloys that include at least one of the elements sulfur (S), tellurium (Te), or selenium (Se). Many chalcogenide alloys may be used to support the configurable resistance of a memory element 220. For example, a memory element 220 may include a germanium-antimony-tellurium alloy (Ge—Sb—Te). Other chalcogenide alloys not expressly recited here may also be employed in a memory element 220.

PCM systems may exploit a relatively large difference in resistance between atomic configurations (e.g., between a more-crystalline state and a more-amorphous state) in certain phase change materials. For example, such materials in the crystalline state may have atoms arranged in a relatively ordered or periodic structure, which may be associated with a relatively low electrical resistance (e.g., in a SET state). By contrast, such materials in an amorphous state may have no or relatively little periodic atomic structure (e.g., a relatively random atomic structure), which may be associated with a relatively high electrical resistance (e.g., in a RESET state).

The difference in electrical resistance between a more-amorphous state and a more-crystalline state of a material may be significant. For example, a material in an amorphous state may have a resistance that is one or more orders of magnitude greater than the resistance of the material in its crystalline state. In some cases, an amorphous state may be associated with a threshold voltage, such that electrical current may not flow through the material until the threshold voltage is exceeded. In some cases, a material may have a distribution of amorphous portions and crystalline portions, and the resistance of the material may be between the resistance associated with a wholly crystalline state and the resistance associated with the wholly amorphous state. In some examples, a material may be used for storage applications other than binary storage applications (e.g., the number of possible logic states stored in a material may be more than two).

To write a particular logic state to a memory cell 105-a, a memory element 220 may be heated in manner to preferentially form a particular atomic configuration, or combination of atomic configurations, associated with the particular logic state. In some examples, such heating may be provided by passing an electric current through the memory cell 105-a. Heating caused by electrical current flowing through a finite resistance may be referred to as Joule or ohmic heating. Joule heating in a memory cell 105-a may thus be related to the electrical resistance of electrodes 205, a memory element 220, a selector device 215, or various combinations thereof. In other examples, memory element 220 may be heated by means other than Joule heating (e.g., by using a laser or other radiation, friction, or acoustic vibrations).

The atomic configuration formed in the material of a memory element 220 may be related to the temperature of the material over time through a write operation. For example, to set a high-resistance state (e.g., a RESET state) associated with a more-amorphous atomic configuration, the material may first be heated to a temperature higher than a temperature associated with forming a disordered atomic configuration of the material, which may be referred to as a melting temperature or a critical temperature. When the material is above the melting temperature or critical temperature, the material may be in a relatively disordered atomic configuration. In order to maintain the disordered atomic configuration after a write operation is completed, the heating that was applied to the memory element 220 may be removed relatively quickly, such that the temperature of the material drops relatively quickly (e.g., as a result of heat dissipation through the electrodes 205 or access lines 110 or 115). Thus, with a relatively rapid cooling of the memory element 220, the elements of the material may not have sufficient time to become substantially ordered (e.g., lacking time to substantially crystallize), and the material may be relatively "locked" or "frozen" in the disordered configuration associated with the more-amorphous state. A "more-amorphous" state or atomic configuration may refer to an entirely amorphous state, or a substantially amorphous state that has relatively little crystallinity (e.g., relatively few, and/or relatively small portions of the material element having atomic periodicity).

In some examples, the current or voltage applied to the memory element 220 in a RESET operation may be associated with, or otherwise referred to as a "RESET pulse," and removing the RESET pulse may cause sufficiently rapid cooling in the memory element 220 to form the more-amorphous state in the 220. Thus, in some examples, a write operation for a RESET state may include a single RESET pulse (e.g., a single write current or voltage application), without a subsequent write pulse of the write operation.

In another example, to set a low-resistance state (e.g., a SET state) associated with a more-crystalline atomic configuration, the material may also be first heated to a temperature higher than the temperature associated with forming a disordered atomic configuration of the material (e.g., the melting temperature or critical temperature). In order to form a more-ordered atomic configuration (e.g., a more-crystalline state), the heating applied to the memory element 220 may be removed relatively slowly, such that the temperature of the material drops relatively slowly. The relatively slow cooling may support the formation of a relatively ordered state of the elements of the material, which may be referred to as a "nucleation" and "growth" of a crystalline phase, or simply "crystallization." In other words, with a relatively slow cooling from the elevated temperature associated with forming the disordered state, the more-crystalline state may be formed in a memory element 220 to write the low-resistance state. A "more-crystalline" state or atomic configuration may refer to an entirely crystalline state (e.g., a single crystal), or a substantially crystalline state that has relatively substantial crystallinity (e.g., relatively large portions of the material element having atomic periodicity).

Depending on the rate of cooling, nucleation of the crystalline atomic structure may occur at relatively more or fewer portions of a memory element 220, which may cause the memory element to form discrete portions of crystalline material which may be referred to as "grains." In some examples, the relative size of such grains and/or the relative number of grains throughout a memory element 220 may contribute to different levels of resistance in a memory element 220. In some examples, a relative granularity of a crystalline atomic configuration may be specifically configured to support two or more logic states in a memory element.

In some examples, the initial current applied to the memory element 220 in a SET operation may also be associated with, or otherwise referred to as a "RESET pulse" (e.g., the same pulse applied in a RESET write operation). However, in a SET operation the RESET pulse may be followed by a subsequent application of current or voltage across the memory element 220 that may be associated with, or otherwise referred to as a "SET pulse," where the SET pulse may support cooling of the memory element 220 that is sufficiently slow to form the more-crystalline state in the memory element 220. Thus, in some examples, a write operation for a SET state may include a RESET pulse (e.g., a single write current or voltage application) and also include a subsequent SET pulse.

In some examples, the memory element 220 may include a material (e.g., a chalcogenide memory component) that is configurable to use a non-uniform compositional distribution (e.g., distribution of ions) to indicate the logic state stored in the memory cell 105-a. For example, ions may migrate towards a particular electrode, depending on the polarity of the programming pulse applied to a given memory cell. The logic state stored in such a memory cell 105 may be based on the distribution of ions in the chalcogenide memory component. In some examples, such memory cells 105 may be referred to as an SSM memory cell 105.

In examples where the memory element 220 is configurable to use a non-uniform compositional distribution to indicate the logic state stored in the memory cell 105-a, the threshold voltage of the memory element 220 may be variable based on a polarity of a write operation (e.g., a write pulse or write signal) used to program the memory cell 105-a. For example, when the memory cell 105-a is programmed with a first polarity (e.g., a positive polarity), the memory element 220 may have certain resistive and/or electrical properties and thus a first threshold voltage. When the memory cell 105-a is programmed with a second polarity (e.g., a negative polarity), the memory element 220 may have different resistive and/or electrical properties and thus a second threshold voltage (e.g., different from the first threshold voltage). These electrical features of the memory element 220 may be caused by differences in ion migration that occur based on the characteristics of the write operation, including the polarity, magnitude, and/or shape of an applied voltage or current of the write operation.

The current flowing through a memory element 220 to support such heating and cooling profiles may result from applying a voltage across memory cell 105-a (e.g., via an access line 110 and an access line 115). In some examples, the applied voltage may be based on the threshold voltage of the memory element 220, the threshold voltage of selector device 215, or combinations thereof. For example, if a memory element 220 is in a RESET state, current may not flow through memory cell 105-a unless the applied voltage is greater than the sum of the threshold voltages of selector device 215 and the memory element 220.

After applying a write voltage (e.g., a RESET pulse, or a RESET pulse and a SET pulse), the memory cell 105-a may be read by applying a read voltage across the memory cell 105-a. Like applying the write voltage, the application of the read voltage may result in current flowing across the memory cell 105-a. The magnitude of the current may depend on the resistance of the memory element 220 (e.g., as written to a more-amorphous state or as written to a more-crystalline state, or as written to one compositional distribution or another), and accordingly the magnitude of the current may be used to determine a logic state stored by the memory cell 105-a.

Figure 3:
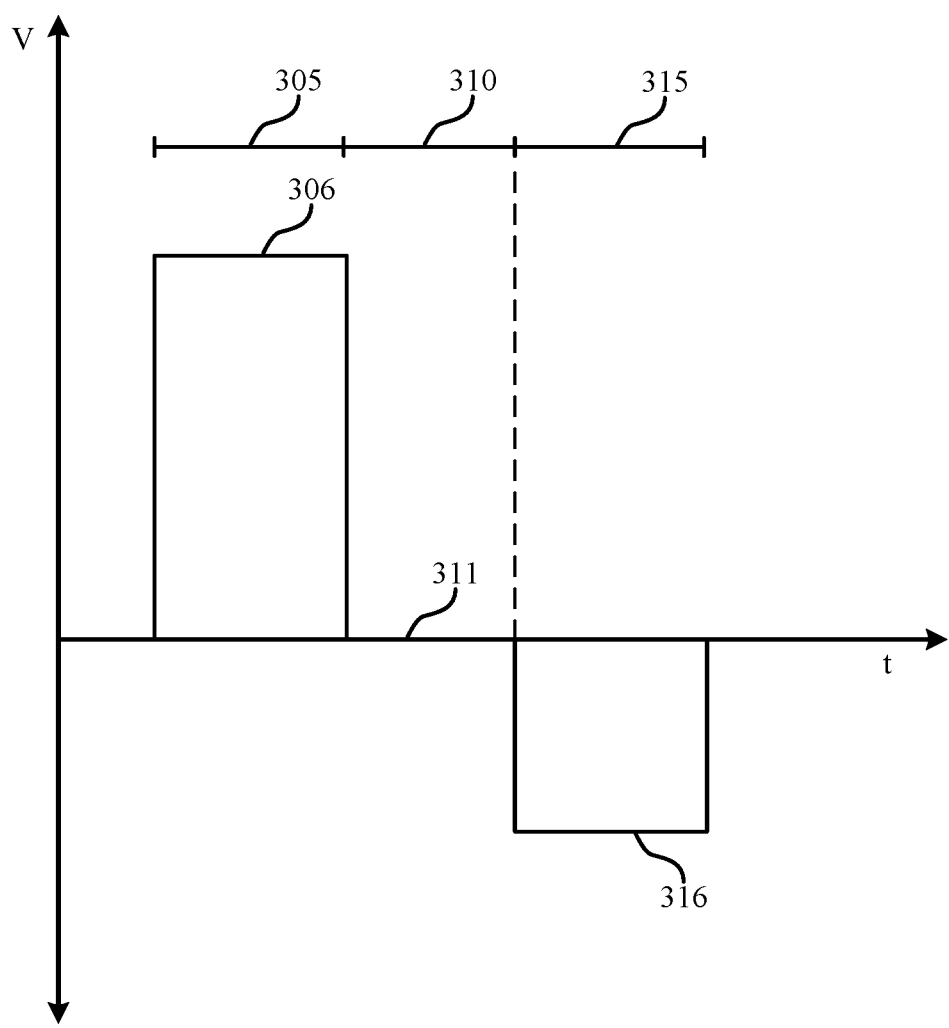
FIGS. 3 through 5 illustrate examples of timing diagrams that support polarity-conditioned memory cell write operations in accordance with examples of the present disclosure.

FIG. 3 illustrates an example of a timing diagram 300 that supports polarity-conditioned memory cell write operations in accordance with various examples of the present disclosure. The timing diagram 300 includes a horizontal axis that represents time, and a vertical axis that represents electrical potential (e.g., voltage) across a memory cell 105 (e.g., memory cell 105-a as described with reference to FIG. 2). The timing diagram illustrates a duration 305, a duration 310, and a duration 315. In some examples, the duration 305, the duration 310, and the duration 315 may collectively be associated with a write operation (e.g., writing a particular logic state to a memory cell 105). In some examples, the duration 305 and the duration 315 may illustrate two different write operations (e.g., writing two logic states to a memory cell 105, which may be the same or different logic states). Although the timing diagram 300 shows voltages as having opposite polarities (e.g., a positive polarity or a negative polarity), the timing diagram 300 may be more generally illustrative of a write operation that includes applying voltages having different polarities, such as applying electric fields across a memory cell 105 in different (e.g., non-parallel) directions.

The memory cell 105 being written by the write operation of timing diagram 300 may, in some examples, include a memory element 220 (e.g., a memory element 220 as described with reference to FIG. 2), and may be coupled with a first access line (e.g., an access line 110 as described with reference to FIGS. 1 and 2) and a second access line (e.g., an access line 115 as described with reference to FIGS. 1 and 2). Accordingly, the timing diagram may be illustrative of a write operation associated with writing a logic state to a memory cell 105 according to a particular resistance state, a particular atomic configuration, or a particular compositional distribution. In some examples, the memory cell 105 being written by the write operation of timing diagram 300 may further include a selector device 215 (e.g., selector device 215 as described with reference to FIG. 2), or the memory cell 105 may be an example of an SSM memory cell 105.

A logic state may be written to the memory cell 105 by performing a write operation in accordance with the timing diagram 300, which may include applying write voltages via the first access line and the second access line. The write voltages illustrated by the timing diagram 300 may drive current through the memory cell 105, which may cause a temperature profile over time that configures the memory element 220 of the memory cell 105 with an atomic configuration, or combination of atomic configurations (e.g., a more-crystalline state, a more-amorphous state, or a combination of crystalline and amorphous states). The composition of the memory element 220 (e.g., the degree of amorphousness and/or crystallinity, or the degree of granularity of crystal grains) may correspond to a different logic state (e.g., a logic 1, a logic 0).

The direction of current flow through the memory cell 105 may depend on the polarity of the write voltages applied during the timing diagram 300. For example, to write to the memory cell 105 with a positive current, a voltage with a first polarity (e.g., a positive polarity) may be applied across the memory cell 105 by applying a positive or other relatively high write voltage to the second access line, and a ground or virtual ground voltage to the first access line, or some other relatively lower voltage (e.g., a negative voltage, or less positive voltage) to the first access line. Applying the write voltage having a positive polarity across the memory cell 105 may result in a positive current flowing across the memory cell 105.

To write to the memory cell 105 with a negative current, a voltage with a second polarity (e.g., a negative or other relatively low polarity) may be applied across the memory cell 105 by applying a negative write voltage to the second access line, and a ground or virtual ground voltage to the first access line, or some other relatively higher voltage (e.g., a positive voltage, or less negative voltage) to the first access line. Applying the write voltage having a positive polarity across the memory cell 105 may result in a positive current flowing across the memory cell 105. Other examples of applying a voltage with different polarities across a memory cell 105 may be used to support polarity-conditioned memory cell write operations in accordance with the present disclosure.

The timing diagram 300 includes a duration 305 associated with applying a first voltage 306 of the write operation across the memory cell 105, which in some examples may be referred to as a first write voltage, a first write pulse, a first write signal, a first write signal portion, and the like. In some examples, the first voltage 306 of the write operation may be associated with driving a current across the memory cell 105, which may be referred to as a first write current. In some examples, the first voltage 306 of the write operation applied during the duration 305 may be associated with forming a disordered atomic configuration of a memory element 220 (e.g., by heating the memory element above a melting temperature or other critical temperature). The disordered atomic configuration at the elevated temperature may be an unstable state. In some examples, the first voltage 306 may be referred to as a RESET voltage, a RESET pulse, or a RESET signal, and may be a same voltage as would be applied when writing a more-amorphous state to the memory cell 105. In other examples the first voltage 306 may be different than a voltage that would be applied when writing a more-amorphous state to the memory cell 105, and may be referred to as a pseudo-RESET voltage, a pseudo-reset pulse, or a pre-conditioning pulse.

Some examples of a write operation in accordance with the present disclosure may also include a duration 310 associated with a dwell time, which may correspond to a duration in which zero net voltage 311 is applied across the memory cell. In other examples or write operations in accordance with the present disclosure, a duration 310 may be omitted. In other words, some write operations may proceed directly from a first write voltage of the write operation to a second write voltage of the write operation.

The timing diagram 300 includes a duration 315 associated with applying a second voltage 316 of the write operation across the memory cell 105, which in some examples may be referred to as a second write voltage, a second write pulse, a second write signal, a second write signal portion, and the like. In some examples, the second voltage 316 of the write operation may be associated with driving a current across the memory cell 105, which may be referred to as a second write current.

In some examples, the second voltage 316 of the write operation applied during the duration 315 may be associated with forming an ordered atomic configuration of a memory element 220 (e.g., a more-crystalline state). For example, the second voltage 316 applied during the duration 315 may support a relatively slow cooling of the memory element 220, supporting crystallization (e.g., crystalline phase nucleation and growth) in the memory element 220. In some examples, the second voltage 316 may have a magnitude that is less than the magnitude of the first voltage 306. In one example, the second voltage 316 may drive a current through the memory element 220 that provides an amount of ohmic heating that is less than the rate of heat dissipated from the memory element 220 (e.g., through the electrodes 205), such that the temperature of the memory element 220 drops during the duration 315, but at a rate slower than a rate when the second voltage 316 is not applied during the duration 315. Accordingly, in some examples, an amount of ohmic heating applied during the duration 315 may be lower than an amount of ohmic heating applied during the duration 305, thereby allowing the temperature of the memory element 220 to fall during the duration 315.

In some examples, the second voltage 316 may be referred to as a SET voltage, a SET pulse, or a SET signal. Accordingly, in some examples, the combination of the first voltage 306 applied during the duration 305 and the second voltage 316 applied during the duration 315 may correspond to a write operation of a logic state associated with writing a memory cell with a more-crystalline state.

In some examples, the second voltage 316 of the write operation applied during the duration 315 may, like the first voltage 306, be associated with forming a disordered atomic configuration of a memory element 220 (e.g., by heating the memory element above a melting temperature or other critical temperature). The disordered atomic configuration at the elevated temperature may be an unstable state. Thus, in some examples, the first voltage 306 and the second voltage 316 may separately or collectively be referred to as a RESET voltage, a RESET pulse, or a RESET signal, and may correspond to a write operation of a logic state associated with writing a memory cell with a more-amorphous state (e.g., when the memory element 220 is allowed to cool rapidly after applying the second voltage during the duration 315).

In another example, the duration 305 and the duration 315 may refer to different write operations, each associated with writing a logic state to a memory cell 105 (e.g., a same logic state, or different logic states). The duration 305 may be associated with applying a first voltage 306 with a first polarity (e.g., a positive polarity) across the memory cell 105, which may write a portion of the memory cell 105 (e.g., a memory element 220) with a particular resistance state, atomic configuration, or compositional distribution. In some examples, a portion of a memory device performing the operations of the timing diagram 300 may be configured to store, or otherwise identify the polarity of the first voltage 306 (e.g., a polarity of a preceding write operation), and determine the polarity for the second voltage 316 based at least in part on the identified polarity of the first voltage 306 (e.g., a different polarity than the preceding write operation). The duration 315 may thus be associated with applying a second voltage 316 with a second polarity (e.g., a negative polarity), different from the first polarity, across the memory cell 105, which may write a portion of the memory cell 105

(e.g., the memory element 220) with a particular resistance state, atomic configuration, or compositional distribution. In this example, the duration 310 may be associated with a time between the first write operation and the second write operation, during which one or more read operations or other access operations of the memory cell 105 may take place.

Although the first voltage 306 and the second voltage 316 are each illustrated as a step change in voltage, various examples of write operations (e.g., polarity-conditioned memory cell write operations) in accordance with the present disclosure may include applying one or more voltages with different profiles over time. For example, one or both of the first voltage 306 or the second voltage 316 may be applied as a step change in voltage, a ramped change in voltage, a triangular change in voltage, an exponential change in voltage, a logarithmic change in voltage, or any other profile.

Further, the voltages illustrated by the timing diagram 300 may refer to various portions of a circuit that includes a memory cell 105. For example, the illustrated voltages may refer to voltages across the terminals of a memory cell 105, across the memory element 220 of a memory cell, between electrodes 205 of a memory cell, between a location of a first access line (e.g., an access line 115) and a location of a second access line (e.g., an access line 110), or source voltages coupled with a memory cell 105 (e.g., a difference between two voltage sources in electronic communication with the memory cell 105).

Performing a write operation having different voltage polarities, which may be illustrated by the timing diagram 300, may be associated with higher performance of a memory array than when performing write operations consisting of a single voltage polarity. For example, applying a voltage across a memory cell 105 may be associated with composition segregation across the memory cell 105 (e.g., across a memory element 220), which may affect the rate or reliability in which a particular logic state is written to the memory cell 105. When performing a write operation having different polarities in accordance with the present disclosure, such element segregation may be mitigated. Thus, such a write operation may be configured to be completed in a shorter time, for example, than a write operation having a voltage of a single polarity, among other advantages.

Further, performing consecutive write operations having different voltage polarities, which may also be illustrated by the timing diagram 300, may be associated with higher performance of a memory array than when performing consecutive write operations having the same voltage polarity. For example, applying a voltage across a memory cell 105 may be associated with composition segregation across the memory cell 105 (e.g., across a memory element 220), which may affect the rate or reliability in which a particular logic state is written to the memory cell 105. When performing consecutive write operations having different polarities in accordance with the present disclosure, such element segregation may be mitigated. Thus, such consecutive write operations may be configured to be completed in a shorter time, for example, than consecutive write operations having voltages of the same polarity, among other advantages.

In another example (not shown), the polarities of the write voltages (e.g., first voltage 306 and second voltage 316) across the memory cell 105 may be reversed as would be understood by a person of ordinary skill in the art. For example, the first voltage 306 may alternatively be applied with a negative polarity across the memory cell 105, and the second voltage 316 may alternatively be applied with a positive polarity across the memory cell 105. In some examples, a first write operation having a first sequence of different polarities (e.g., as illustrated by the timing diagram 300) may be referred to as a "forward" write operation, and a second write operation having a second sequence of polarities opposite from the first sequence of different polarities (e.g., polarities opposite from those illustrated in timing diagram 300) may be referred to as a "reverse" write operation. Further, a first sequence of different polarities may be applied to a first set of memory cells 105 in a memory array (e.g., a first layer of memory cells 105), and a second write operation having a second sequence of polarities opposite from the first sequence of different polarities may be applied to a second set of memory cells 105 in the memory array (e.g., a second layer of memory cells 105). In these various examples, the same benefits described above (e.g., mitigating element segregation across the memory cell 105) may be realized in a memory array.

In some examples, a memory device associated with the operations of the timing diagram 300 may be configured to store, or otherwise identify a direction of a preceding write operation (e.g., whether a preceding write operation was a forward write operation or a reverse write operation), so that a subsequent write operation is in a different direction from the preceding operation. For example, the memory device may determine that a reverse write operation is to be performed on a memory cell 105 after identifying that a preceding write operation on the memory cell 105 was a forward write operation, or the memory device may determine that a forward write operation is to be performed on a memory cell 105 after identifying that a preceding write operation on the memory cell 105 was a reverse write operation.

After a write operation such as applying the write voltages illustrated by the timing diagram 300, a written memory cell 105 may be subsequently read (e.g., sensed) with a subsequent read operation. A read operation may include applying one or more voltages (e.g., one or more read voltages) across the memory cell, and determining the stored logic state based on the response to applying the one or more voltages.

In various examples, the read voltages in a subsequent read operation may have a polarity across a memory cell 105 that is based at least in part on the polarity of a preceding write operation across the same memory cell 105. For example, the polarity of a first read voltage of a subsequent read operation may be an opposite or otherwise different polarity across the memory cell 105 as compared with the polarity of the second voltage 316 during the duration 315. For example, a depicted in timing diagram, because the second voltage 316 of the write operation applied during the duration 315 is applied with a negative polarity, the first read voltage of a subsequent read operation may be applied with a positive polarity across the memory cell 105. In some examples, applying a read voltage having a polarity opposite from a polarity of a preceding write voltage may result in a relatively high threshold voltage when reading the memory cell.

In another example, the polarity of a first read voltage of a subsequent read operation may be the same as the polarity of the second write voltage during the duration 315. For example, a depicted in timing diagram, because the second voltage 316 of the write operation applied during the duration 315 is applied with a negative polarity, the first read voltage of a subsequent read operation may also be applied with a negative polarity across the memory cell 105. In some examples, applying a read voltage having the same polarity as a preceding write voltage may result in a relatively low threshold voltage when reading the memory cell.

Figure 4:
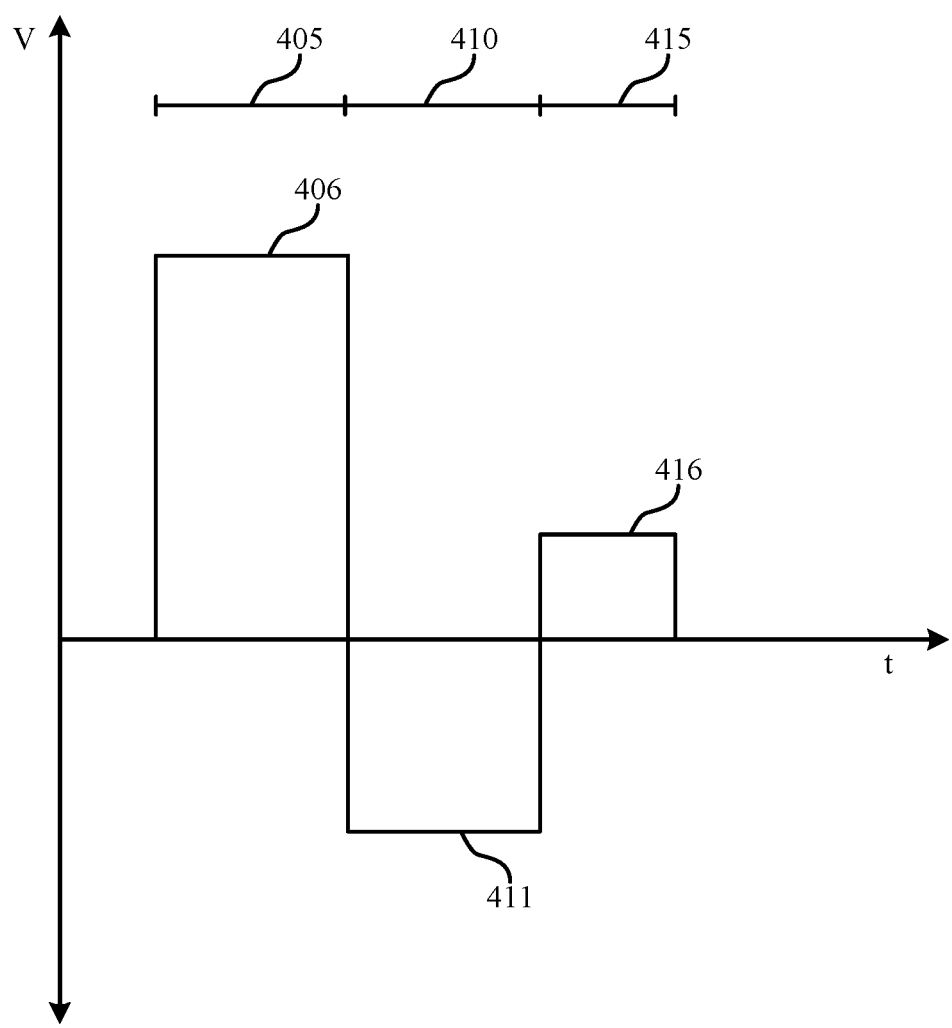

FIG. 4 illustrates an example of a timing diagram 400 that supports polarity-conditioned memory cell write operations in accordance with various examples of the present disclosure. The timing diagram 400 includes a horizontal axis that represents time, and a vertical axis that represents electrical potential (e.g., voltage) across a memory cell 105 (e.g., memory cell 105-a as described with reference to FIG. 2). The timing diagram illustrates a duration 405, a duration 410, and a duration 415, which may collectively be associated with a write operation (e.g., writing a particular logic state to a memory cell 105). Although the timing diagram 400 shows voltages as having opposite polarities (e.g., a positive polarity or a negative polarity), the timing diagram 400 may be more generally illustrative of a write operation that includes applying voltages having different polarities, such as applying electric fields across a memory cell 105 in different (e.g., non-parallel) directions.

The memory cell 105 being written by the write operation of timing diagram 400 may, in some examples, include a memory element 220 (e.g., a memory element 220 as described with reference to FIG. 2), and may be coupled with a first access line (e.g., an access line 110 as described with reference to FIGS. 1 and 2) and a second access line (e.g., an access line 115 as described with reference to FIGS. 1 and 2). Accordingly, the timing diagram may be illustrative of a write operation associated with writing a logic state to a memory cell 105 according to a particular resistance state, a particular atomic configuration, or a particular compositional distribution. In some examples, the memory cell 105 being written by the write operation of timing diagram 400 may further include a selector device 215 (e.g., selector device 215 as described with reference to FIG. 2), or the memory cell 105 may be an example of an SSM memory cell 105.

A logic state may be written to the memory cell 105 by performing a write operation in accordance with the timing diagram 400, which may include applying write voltages via the first access line and the second access line. The write voltages illustrated by the timing diagram 400 may drive current through the memory cell 105, which may cause a temperature profile over time that configures the memory element 220 of the memory cell 105 with an atomic configuration, or combination of atomic configurations (e.g., a more-crystalline state, a more-amorphous state, or a combination of crystalline and amorphous states). The composition of the memory element 220 (e.g., the degree of amorphousness and/or crystallinity, or the degree of granularity of crystal grains) may correspond to a different logic state (e.g., a logic 1, a logic 0).

The direction of current flow through the memory cell 105 may depend on the polarity of the write voltages applied during the timing diagram 400. For example, to write to the memory cell 105 with a positive current, a voltage with a first polarity (e.g., a positive polarity) may be applied across the memory cell 105 by applying a positive or other relatively high write voltage to the second access line, and a ground or virtual ground voltage to the first access line, or some other relatively lower voltage (e.g., a negative voltage, or less positive voltage) to the first access line. Applying the write voltage having a positive polarity across the memory cell 105 may result in a positive current flowing across the memory cell 105.

To write to the memory cell 105 with a negative current, a voltage with a second polarity (e.g., a negative or other relatively low polarity) may be applied across the memory cell 105 by applying a negative write voltage to the second access line, and a ground or virtual ground voltage to the first access line, or some other relatively higher voltage (e.g., a positive voltage, or less negative voltage) to the first access line. Applying the write voltage having a positive polarity across the memory cell 105 may result in a positive current flowing across the memory cell 105. Other examples of applying a voltage with different polarities across a memory cell 105 may be used to support polarity-conditioned memory cell write operations in accordance with the present disclosure.

The timing diagram 400 includes a duration 405 associated with applying a first voltage 406 of the write operation across the memory cell 105, which may be referred to as a first write voltage, a first write pulse, a first write signal, a first write signal portion, and the like. In some examples, the first voltage 406 of the write operation may be associated with driving a current across the memory cell 105, which may be referred to as a first write current. In some examples, the first voltage 406 of the write operation applied during the duration 405 may be associated with forming a disordered atomic configuration of a memory element 220 (e.g., by heating the memory element above a melting temperature or other critical temperature). The disordered atomic configuration at the elevated temperature may be an unstable state. In some examples, the first voltage 406 may be referred to as a RESET voltage, a RESET pulse, or a RESET signal, and may be a same voltage as would be applied when writing a more-amorphous state to the memory cell 105. In other examples the first voltage 406 may be different than a voltage that would be applied when writing a more-amorphous state to the memory cell 105, and may be referred to as a pseudo-RESET voltage, a pseudo-reset pulse, or a pre-conditioning pulse.

The timing diagram 400 includes a duration 410 associated with applying a second voltage 411 of the write operation across the memory cell 105, which may be referred to as a second write voltage, a second write pulse, a second write signal, a second write signal portion, and the like. In some examples, the second voltage 411 of the write operation may be associated with driving a current across the memory cell 105, which may be referred to as a second write current.

The timing diagram 400 also includes a duration 415 associated with applying a third voltage 416 of the write operation across the memory cell 105, which may be referred to as a third write voltage, a third write pulse, a third write signal, a third write signal portion, and the like. In some examples, the third voltage 416 of the write operation may be associated with driving a current across the memory cell 105, which may be referred to as a third write current.

In some examples, the second voltage 411 and the third voltage 416 of the write operation may be associated with forming an ordered atomic configuration of a memory element 220 (e.g., a more-crystalline state). For example, the collective application of the second voltage 411 and the third voltage 416 may support a relatively slow cooling of the memory element 220, supporting crystallization (e.g., crystalline phase nucleation and growth) in the memory element 220. In some examples, one or both of the second voltage 411 or the third voltage 416 may have a magnitude that is less than the magnitude of the first voltage 406. In one example, the second voltage 411 and the third voltage 416 may drive a current through the memory element 220 that provides an amount of ohmic heating that is less than the rate of heat dissipated from the memory element 220 (e.g., through the electrodes 205), such that the temperature of the memory element 220 drops during the duration 410 and the duration 415, but at a rate slower than a rate when the second voltage 411 and the third voltage 416 are not applied during the duration 410 and duration 415. Accordingly, in some examples, an amount of ohmic heating applied during the duration 410 and duration 415 may be lower than an amount of ohmic heating applied during the duration 405, thereby allowing the temperature of the memory element 220 to fall during the duration 410 and duration 415.

In some examples, the second voltage 411 and the third voltage 416 may be individually or collectively referred to as a SET voltage, a SET pulse, or a SET signal. Accordingly, in some examples, the combination of the first voltage 406 applied during the duration 405, the second voltage 411 during the duration 410, and the third voltage 416 applied during the duration 415 may correspond to a write operation of a logic state associated with writing a memory cell with a more-crystalline state.

In some examples, the second voltage 411 and the third voltage 416 of the write operation may, like the first voltage 406, be associated with forming a disordered atomic configuration of a memory element 220 (e.g., by heating the memory element above a melting temperature or other critical temperature). The disordered atomic configuration at the elevated temperature may be an unstable state. Thus, in some examples, the first voltage 406, the second voltage 411, and the third voltage 416 may separately or collectively be referred to as a RESET voltage, a RESET pulse, or a RESET signal, and may correspond to a write operation of a logic state associated with writing a memory cell with a more-amorphous state (e.g., when the memory element 220 is allowed to cool rapidly after applying the second voltage during the duration 415).

Although first voltage 406, the second voltage 411, and the third voltage 416 are each illustrated as a step change in voltage, various examples of write operations (e.g., polarity-conditioned memory cell write operations) in accordance with the present disclosure may include applying one or more voltages with different profiles over time. For example, any one or more of the first voltage 406, the second voltage 411, or the third voltage 416 may be applied as a step change in voltage, a ramped change in voltage, a triangular change in voltage, an exponential change in voltage, a logarithmic change in voltage, or any other profile.

Further, the voltages illustrated by the timing diagram 400 may refer to various portions of a circuit that includes a memory cell 105. For example, the illustrated voltages may refer to voltages across the terminals of a memory cell 105, across the memory element 220 of a memory cell, between electrodes 205 of a memory cell, between a location of a first access line (e.g., an access line 115) and a location of a second access line (e.g., an access line 110), or source voltages coupled with a memory cell 105 (e.g., a difference between two voltage sources in electronic communication with the memory cell 105).

Performing a write operation having different voltage polarities, such as the example write operation illustrated by the timing diagram 400, may be associated with higher performance of a memory array than when performing write operations consisting of a single voltage polarity. For example, applying a voltage across a memory cell 105 may be associated with composition segregation across the memory cell 105 (e.g., across a memory element 220), which may affect the rate or reliability in which a particular logic state is written to the memory cell 105. When performing a write operation having different polarities in accordance with the present disclosure, such element segregation may be mitigated. Thus, such a write operation may be configured to be completed in a shorter time, for example, than a write operation having a voltage of a single polarity, among other advantages.

In another example (not shown), the polarities of the write voltages (e.g., the first voltage 406, the second voltage 411, or the third voltage 416) across the memory cell 105 may be reversed as would be understood by a person of ordinary skill in the art. For example, the first voltage 406 may alternatively be applied with a negative polarity across the memory cell 105, the second voltage 411 may alternatively be applied with a positive polarity across the memory cell 105, and the third voltage 416 may alternatively be applied with a negative polarity across the memory cell 105. In some examples, a first write operation having a first sequence of different polarities (e.g., as illustrated by the timing diagram 400) may be referred to as a "forward" write operation, and a second write operation having a second sequence of polarities opposite from the first sequence of different polarities (e.g., polarities opposite from those illustrated in timing diagram 400) may be referred to as a "reverse" write operation. Further, a first sequence of different polarities may be applied to a first set of memory cells 105 in a memory array (e.g., a first layer of memory cells 105), and a second write operation having a second sequence of polarities opposite from the first sequence of different polarities may be applied to a second set of memory cells 105 in the memory array (e.g., a second layer of memory cells 105). In these various examples, the same benefits described above (e.g., mitigating element segregation across the memory cell 105) may be realized in a memory array.

In some examples, a memory device associated with the operations of the timing diagram 400 may be configured to store, or otherwise identify a direction of a preceding write operation (e.g., whether a preceding write operation was a forward write operation or a reverse write operation), so that a subsequent write operation is in a different direction from the preceding operation. For example, the memory device may determine that a reverse write operation is to be performed on a memory cell 105 after identifying that a preceding write operation on the memory cell 105 was a forward write operation, or the memory device may determine that a forward write operation is to be performed on a memory cell 105 after identifying that a preceding write operation on the memory cell 105 was a reverse write operation.

After a write operation such as applying the write voltages illustrated by the timing diagram 400, a written memory cell 105 may be subsequently read (e.g., sensed) with a subsequent read operation. A read operation may include applying one or more voltages (e.g., one or more read voltages) across the memory cell, and determining the stored logic state based on the response to applying the one or more voltages.

In various examples, the read voltages in a subsequent read operation may have a polarity across a memory cell 105 that is based at least in part on the polarity of a preceding write operation across the same memory cell 105. For example, the polarity of a first read voltage of a subsequent read operation may be an opposite or otherwise different polarity across the memory cell 105 as compared with the polarity of the third voltage 416 during the duration 415. For example, a depicted in timing diagram, because the third voltage 416 of the write operation applied during the duration 415 is applied with a positive polarity, the first read voltage of a subsequent read operation may be applied with a negative polarity across the memory cell 105. In some examples, applying a read voltage having a polarity opposite from a polarity of a preceding write voltage may result in a relatively high threshold voltage when reading the memory cell.

In another example, the polarity of a first read voltage of a subsequent read operation may be the same as the polarity of the second write voltage during the duration 415. For example, a depicted in timing diagram, because the third voltage 416 of the write operation applied during the duration 415 is applied with a positive polarity, the first read voltage of a subsequent read operation may also be applied with a positive polarity across the memory cell 105. In some examples, applying a read voltage having the same polarity as a preceding write voltage may result in a relatively low threshold voltage when reading the memory cell.

Figure 5:
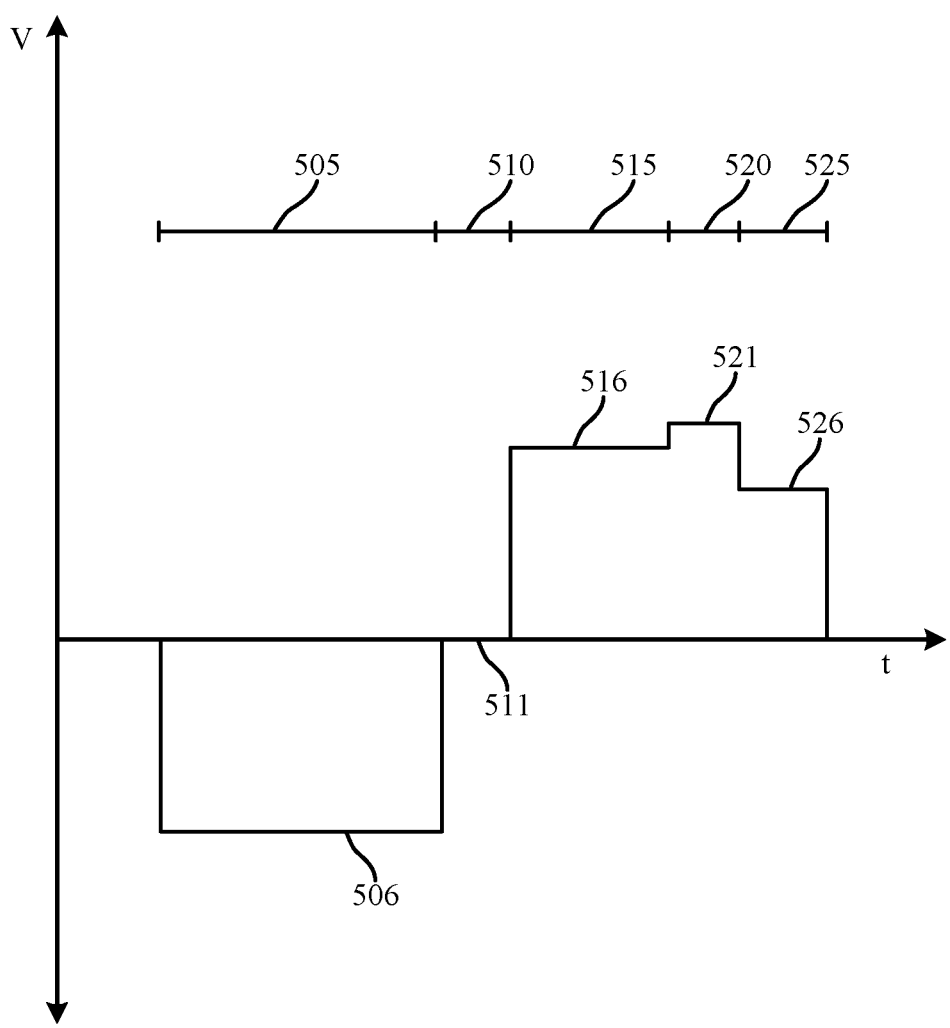

FIG. 5 illustrates an example of a timing diagram 500 that supports polarity-conditioned memory cell write operations in accordance with various examples of the present disclosure. The timing diagram 500 includes a horizontal axis that represents time, and a vertical axis that represents electrical potential (e.g., voltage) across a memory cell 105 (e.g., memory cell 105-*a* as described with reference to FIG. 2). The timing diagram illustrates a duration 505, a duration 510, a duration 515, a duration 520, and a duration 525, which may collectively be associated with a write operation (e.g., writing a particular logic state to a memory cell 105). Although the timing diagram 500 shows voltages as having opposite polarities (e.g., a positive polarity or a negative polarity), the timing diagram 500 may be more generally illustrative of a write operation that includes applying voltages having different polarities, such as applying electric fields across a memory cell 105 in different (e.g., non-parallel) directions.

The memory cell 105 being written by the write operation of timing diagram 500 may, in some examples, include a memory element 220 (e.g., a memory element 220 as described with reference to FIG. 2), and may be coupled with a first access line (e.g., an access line 110 as described with reference to FIGS. 1 and 2) and a second access line (e.g., an access line 115 as described with reference to FIGS. 1 and 2). Accordingly, the timing diagram may be illustrative of a write operation associated with writing a logic state to a memory cell 105 according to a particular resistance state, a particular atomic configuration, or a particular compositional distribution. In some examples, the memory cell 105 being written by the write operation of timing diagram 500 may further include a selector device 215 (e.g., selector device 215 as described with reference to FIG. 2), or the memory cell 105 may be an example of an SSM memory cell 105.

A logic state may be written to the memory cell 105 by performing a write operation in accordance with the timing diagram 500, which may include applying write voltages via the first access line and the second access line. The write voltages illustrated by the timing diagram 500 may drive current through the memory cell 105, which may cause a temperature profile over time that configures the memory element 220 of the memory cell 105 with an atomic configuration, or combination of atomic configurations (e.g., a more-crystalline state, a more-amorphous state, or a combination of crystalline and amorphous states). The composition of the memory element 220 (e.g., the degree of amorphousness and/or crystallinity, or the degree of granularity of crystal grains) may correspond to a different logic state (e.g., a logic 1, a logic 0).

The direction of current flow through the memory cell 105 may depend on the polarity of the write voltages applied during the timing diagram 500. For example, to write to the memory cell 105 with a positive current, a voltage with a first polarity (e.g., a positive polarity) may be applied across the memory cell 105 by applying a positive or other relatively high write voltage to the second access line, and a ground or virtual ground voltage to the first access line, or some other relatively lower voltage (e.g., a negative voltage, or less positive voltage) to the first access line. Applying the write voltage having a positive polarity across the memory cell 105 may result in a positive current flowing across the memory cell 105.

To write to the memory cell 105 with a negative current, a voltage with a second polarity (e.g., a negative or other relatively low polarity) may be applied across the memory cell 105 by applying a negative write voltage to the second access line, and a ground or virtual ground voltage to the first access line, or some other relatively higher voltage (e.g., a positive voltage, or less negative voltage) to the first access line. Applying the write voltage having a positive polarity across the memory cell 105 may result in a positive current flowing across the memory cell 105. Other examples of applying a voltage with different polarities across a memory cell 105 may be used to support polarity-conditioned memory cell write operations in accordance with the present disclosure.

The timing diagram 500 includes a duration 505 associated with applying a first voltage 506 of the write operation across the memory cell 105, which may be referred to as a first write voltage, a first write pulse, a first write signal, a first write signal portion, and the like. In some examples, the first voltage 506 of the write operation may be associated with driving a current across the memory cell 105, which may be referred to as a first write current. In some examples, the first voltage 506 of the write operation applied during the duration 505 may be associated with forming a disordered atomic configuration of a memory element 220 (e.g., by heating the memory element above a melting temperature or other critical temperature). The disordered atomic configuration at the elevated temperature may be an unstable state. In some examples, the first voltage 506 may be referred to as a RESET voltage, a RESET pulse, or a RESET signal, and may be a same voltage as would be applied when writing a more-amorphous state to the memory cell 105. In other examples the first voltage 506 may be different than a voltage that would be applied when writing a more-amorphous state to the memory cell 105, and may be referred to as a pseudo-RESET voltage, a pseudo-reset pulse, or a pre-conditioning pulse.

Some examples of a write operation in accordance with the present disclosure may also include a duration 510 associated with a dwell time, which may correspond to a duration in which zero net voltage 511 is applied across the memory cell. In other examples or write operations in accordance with the present disclosure, a duration 510 may be omitted. In other words, some write operations may proceed directly from a first write voltage of the write operation to a second write voltage of the write operation.

The timing diagram 500 includes a duration 515 associated with applying a second voltage 516 of the write operation across the memory cell 105, which may be referred to as a second write voltage, a second write pulse, a second write signal, a second write signal portion, and the like. In some examples, the second voltage 516 of the write operation may be associated with driving a current across the memory cell 105, which may be referred to as a second write current.

The timing diagram 500 also includes a duration 520 associated with applying a third voltage 521 of the write operation across the memory cell 105, which may be referred to as a third write voltage, a third write pulse, a third write signal, a third write signal portion, and the like. In some examples, the third voltage 521 of the write operation may be associated with driving a current across the memory cell 105, which may be referred to as a third write current.

The timing diagram 500 also includes a duration 525 associated with applying a fourth voltage 526 of the write operation across the memory cell 105, which may be referred to as a fourth write voltage, a fourth write pulse, a fourth write signal, a fourth write signal portion, and the like. In some examples, the fourth voltage 526 of the write operation may be associated with driving a current across the memory cell 105, which may be referred to as a fourth write current.

In some examples, the second voltage 516, the third voltage 521, and the fourth voltage 526 of the write operation may be associated with forming an ordered atomic configuration of a memory element 220 (e.g., a more-crystalline state). For example, the collective application of the second voltage 516, the third voltage 521, and the fourth voltage 526 may support a relatively slow cooling of the memory element 220, supporting crystallization (e.g., crystalline phase nucleation and growth) in the memory element 220. In some examples, any one or more of the second voltage 516, the third voltage 521, or the fourth voltage 526 may have a magnitude that is less than the magnitude of the first voltage 506.

In one example, the second voltage 516, the third voltage 521, and the fourth voltage 526 may drive a current through the memory element 220 that provides an amount of ohmic heating that is less than the rate of heat dissipated from the memory element 220 (e.g., through the electrodes 205), such that the temperature of the memory element 220 drops during the duration 515, the duration 520, and the duration 525, but at a rate slower than a rate when the second voltage 411 and the third voltage 416 are not applied during the duration 410 and duration 415. Accordingly, in some examples, an amount of ohmic heating applied during the duration 410 and duration 415 may be lower than an amount of ohmic heating applied during the duration 405, thereby allowing the temperature of the memory element 220 to fall during the duration 410 and duration 415.

In some examples, the second voltage 516, the third voltage 521, and the fourth voltage 526 may be associated with different portions of forming a more-crystalline state. For example, the second voltage 516 may be associated with a nucleation of the crystalline phase, the third voltage 521 may be associated with a growth of the crystalline phase, and the fourth voltage 526 may be associated with a setback of the crystalline phase. In some examples, the second voltage 516, the third voltage 521, and the fourth voltage 526 may separately or collectively be referred to as a SET voltage, a SET pulse, or a SET signal.

Although the first voltage 506, the second voltage 516, the third voltage 521, and the fourth voltage 526 are each illustrated as a step change in voltage, various examples of a write operation (e.g., a polarity-conditioned memory cell write operation) may include applying one or more voltages with different profiles over time. For example, any one or more of first voltage 506, the second voltage 516, the third voltage 521, and the fourth voltage 526 may be applied as a step change in voltage, a ramped change in voltage, a triangular change in voltage, an exponential change in voltage, a logarithmic change in voltage, or any other profile.

Further, the voltages illustrated by the timing diagram 500 may refer to various portions of a circuit that includes a memory cell 105. For example, the illustrated voltages may refer to voltages across the terminals of a memory cell 105, across the memory element 220 of a memory cell, between electrodes 205 of a memory cell, between a location of a first access line (e.g., an access line 115) and a location of a second access line (e.g., an access line 110), or source voltages coupled with a memory cell 105 (e.g., a difference between two voltage sources in electronic communication with the memory cell 105).

Performing a write operation having different voltage polarities, such as the example write operation illustrated by the timing diagram 500, may be associated with higher performance of a memory array than when performing write operations consisting of a single voltage polarity. For example, applying a voltage across a memory cell 105 may be associated with composition segregation across the memory cell 105 (e.g., across a memory element 220), which may affect the rate or reliability in which a particular logic state is written to the memory cell 105. When performing a write operation having different polarities in accordance with the present disclosure, such element segregation may be mitigated. Thus, such a write operation may be configured to be completed in a shorter time, for example, than a write operation having a voltage of a single polarity, among other advantages.

In another example (not shown), the polarities of the write voltages (e.g., first voltage 506, the second voltage 516, the third voltage 521, and the fourth voltage 526) across the memory cell 105 may be reversed as would be understood by a person of ordinary skill in the art. For example, the first voltage 506 may alternatively be applied with a positive polarity across the memory cell 105, and the second voltage 516, the third voltage 521, and the fourth voltage 526 may alternatively be applied with a negative polarity across the memory cell 105. In some examples, a first write operation having a first sequence of different polarities (e.g., as illustrated by the timing diagram 500) may be referred to as a "forward" write operation, and a second write operation having a second sequence of polarities opposite from the first sequence of different polarities (e.g., polarities opposite from those illustrated in timing diagram 500) may be referred to as a "reverse" write operation. Further, a first sequence of different polarities may be applied to a first set of memory cells 105 in a memory array (e.g., a first layer of memory cells 105), and a second write operation having a second sequence of polarities opposite from the first sequence of different polarities may be applied to a second set of memory cells 105 in the memory array (e.g., a second layer of memory cells 105). In these various examples, the same benefits described above (e.g., mitigating element segregation across the memory cell 105) may be realized in a memory array.

In some examples, a memory device associated with the operations of the timing diagram 500 may be configured to store, or otherwise identify a direction of a preceding write operation (e.g., whether a preceding write operation was a forward write operation or a reverse write operation), so that a subsequent write operation is in a different direction from the preceding operation. For example, the memory device may determine that a reverse write operation is to be performed on a memory cell 105 after identifying that a preceding write operation on the memory cell 105 was a forward write operation, or the memory device may determine that a forward write operation is to be performed on a memory cell 105 after identifying that a preceding write operation on the memory cell 105 was a reverse write operation.

After a write operation such as applying the write voltages illustrated by the timing diagram 500, a written memory cell 105 may be subsequently read (e.g., sensed) with a subsequent read operation. A read operation may include applying one or more voltages (e.g., one or more read voltages) across the memory cell, and determining the stored logic state based on the response to applying the one or more voltages.

In various examples, the read voltages in a subsequent read operation may have a polarity across a memory cell 105 that is based at least in part on the polarity of a preceding write operation across the same memory cell 105. For example, the polarity of a first read voltage of a subsequent read operation may be an opposite or otherwise different polarity across the memory cell 105 as compared with the polarity of the fourth voltage 526 during the duration 525. For example, a depicted in timing diagram, because the fourth voltage 526 is applied with a positive polarity, the first read voltage of a subsequent read operation may be applied with a negative polarity across the memory cell 105. In some examples, applying a read voltage having a polarity opposite from a polarity of a preceding write voltage may result in a relatively high threshold voltage when reading the memory cell.

In another example, the polarity of a first read voltage of a subsequent read operation may be the same as the polarity of the second write voltage during the duration 515. For example, a depicted in timing diagram, because the fourth voltage 526 of the write operation is applied with a positive polarity, the first read voltage of a subsequent read operation may also be applied with a positive polarity across the memory cell 105. In some examples, applying a read voltage having the same polarity as a preceding write voltage may result in a relatively low threshold voltage when reading the memory cell.

Figure 6:
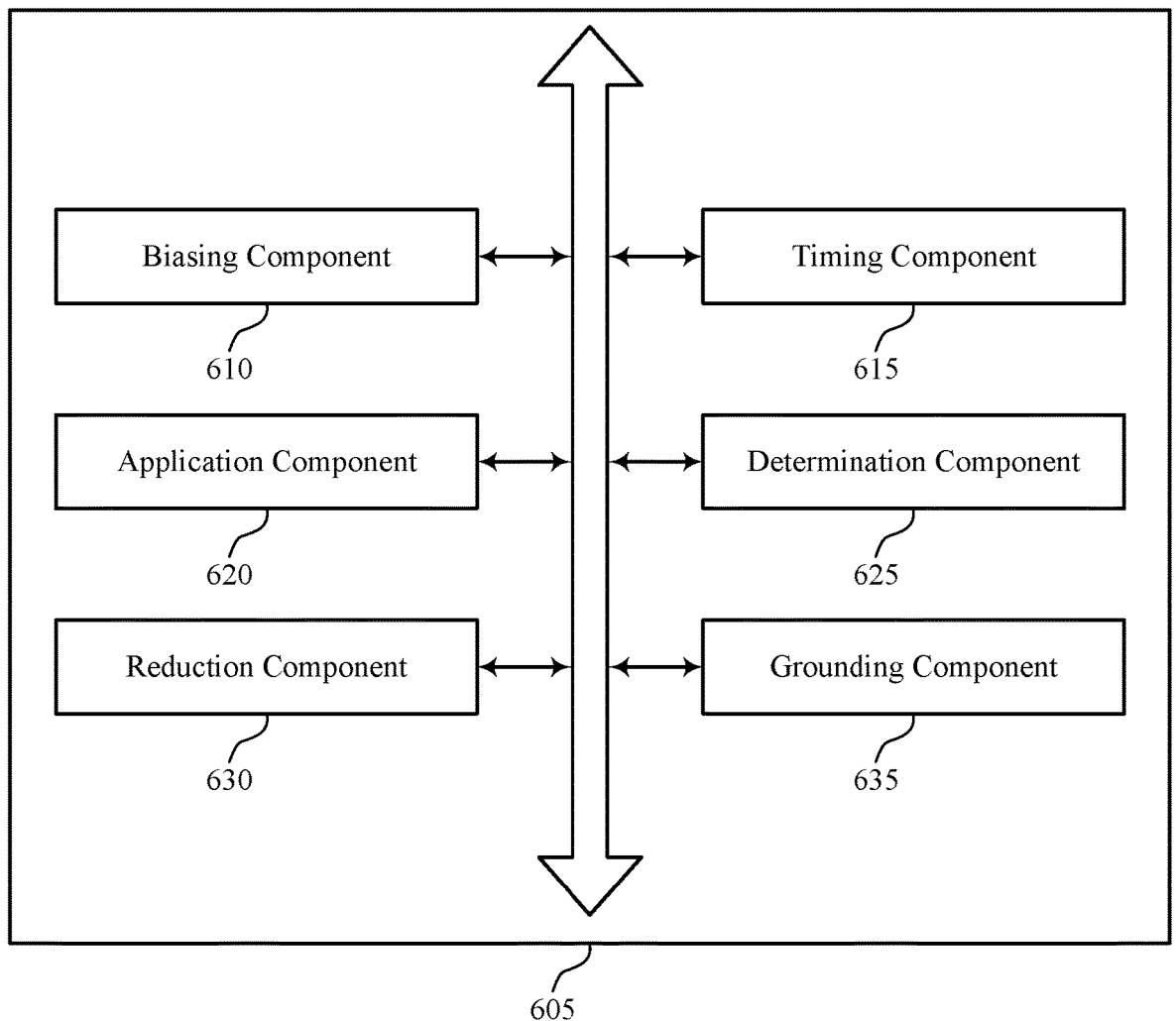
FIG. 6 shows a block diagram of a device that supports polarity-conditioned memory cell write operations in accordance with examples of the present disclosure.

FIG. 6 shows a block diagram 600 of a memory controller 605 that supports polarity-conditioned memory cell write operations in accordance with examples of the present disclosure. The memory controller 605 may be an example of aspects of a memory controller 140 as described with reference to FIG. 1. The memory controller 605 may include biasing component 610, timing component 615, application component 620, determination component 625, reduction component 630, and grounding component 635. Each of these modules may communicate, directly or indirectly, with one another (e.g., via one or more buses).

Application component 620 may apply a write voltage to a memory cell coupled with a first access line and a second access line. In some examples, the memory cell may include a memory storage element and a selector device. In some cases the application component 620 or the biasing component 610 may select an access line (e.g., an access line 110 or an access line 115 coupled with a memory cell to be read or written), or select, enable, or otherwise couple a voltage source with the first access line or the second access line (e.g., to perform the various voltage applications described herein).

In some cases the application component 620 may apply a first voltage of a write operation across a memory cell coupled with a first access line and a second access line, the first write voltage of the write operation having a first polarity, and apply a second write voltage of the write operation across the memory cell after applying the first write voltage of the write operation, the second write voltage of the write operation having a second polarity that is different than the first polarity.

In some cases, the first polarity is opposite from the second polarity. In some cases, applying the first write voltage of the write operation is associated with current flowing through the memory cell in a first direction, and applying the second write voltage is associated with current flowing through the memory cell in a second direction that is different from the first direction.

In some cases applying the first write voltage is associated with forming a first material phase of a portion of the memory cell, and applying the second write voltage is associated with forming a second material phase of the portion of the memory cell. For example, in some cases applying the first write voltage of the write operation is associated with forming an amorphous phase of a phase change material of the memory cell, and applying the second write voltage of the write operation is associated with forming a crystalline phase of the phase change material of the memory cell.

In some cases the application component 620 may apply a third write voltage of the write operation across the memory cell before applying the first write voltage of the write operation, the third write voltage of the write operation having the second polarity. In some cases, applying the third write voltage of the write operation is associated with forming an amorphous phase of a phase change material of the memory cell, and applying the first write voltage of the write operation and applying the second write voltage of the write operation are associated with forming a crystalline phase of the phase change material of the memory cell. In some cases, the second write voltage of the write operation has a lower magnitude than the third write voltage of the write operation.

In some cases the application component 620 may apply a fourth write voltage of the write operation across the memory cell, different than the second write voltage of the write operation, after applying the second write voltage of the write operation, the fourth write voltage of the write operation having the second polarity. In some cases, the second write voltage of the write operation is associated with a nucleation of a crystalline phase of a phase change memory material of the memory cell, and the fourth write voltage is associated with a growth of the crystalline phase of the phase change memory material of the memory cell.

In some cases, the application component 620 may apply a fifth write voltage of the write operation across the memory cell, different than the fourth write voltage of the write operation, after applying the fourth write voltage of the write operation, the fifth write voltage of the write operation having the second polarity. In some cases, the fifth write voltage is associated with a setback of a crystalline phase of a phase change memory material of the memory cell. In various examples, applying a write voltage of the write operation includes: applying a step change in voltage across the memory cell or applying a ramped change in voltage across the memory cell.

In some cases, the application component 620 may be configured to store, or otherwise identify a direction of a preceding write operation (e.g., whether a preceding write operation was a forward write operation or a reverse write operation), so that a subsequent write operation is in a different direction from the preceding operation.

The timing component 615 may perform various timing operations, such as triggering various read or write operations described herein.

Determination component 625 may determine a logic state of the memory cell (e.g., based at least in part on applying a read voltage). In other examples, determination component 625 may determine a logic state of the memory cell based at least in part on applying a read pulse. Determination component 625 may also determine a logic state to be written to a memory cell.

Reduction component 630 may reduce a voltage after determining a logic state of the memory cell.

Grounding component 635 may ground at least one of a first access line or a second access line after applying a read voltage or a write voltage.

Figure 7:
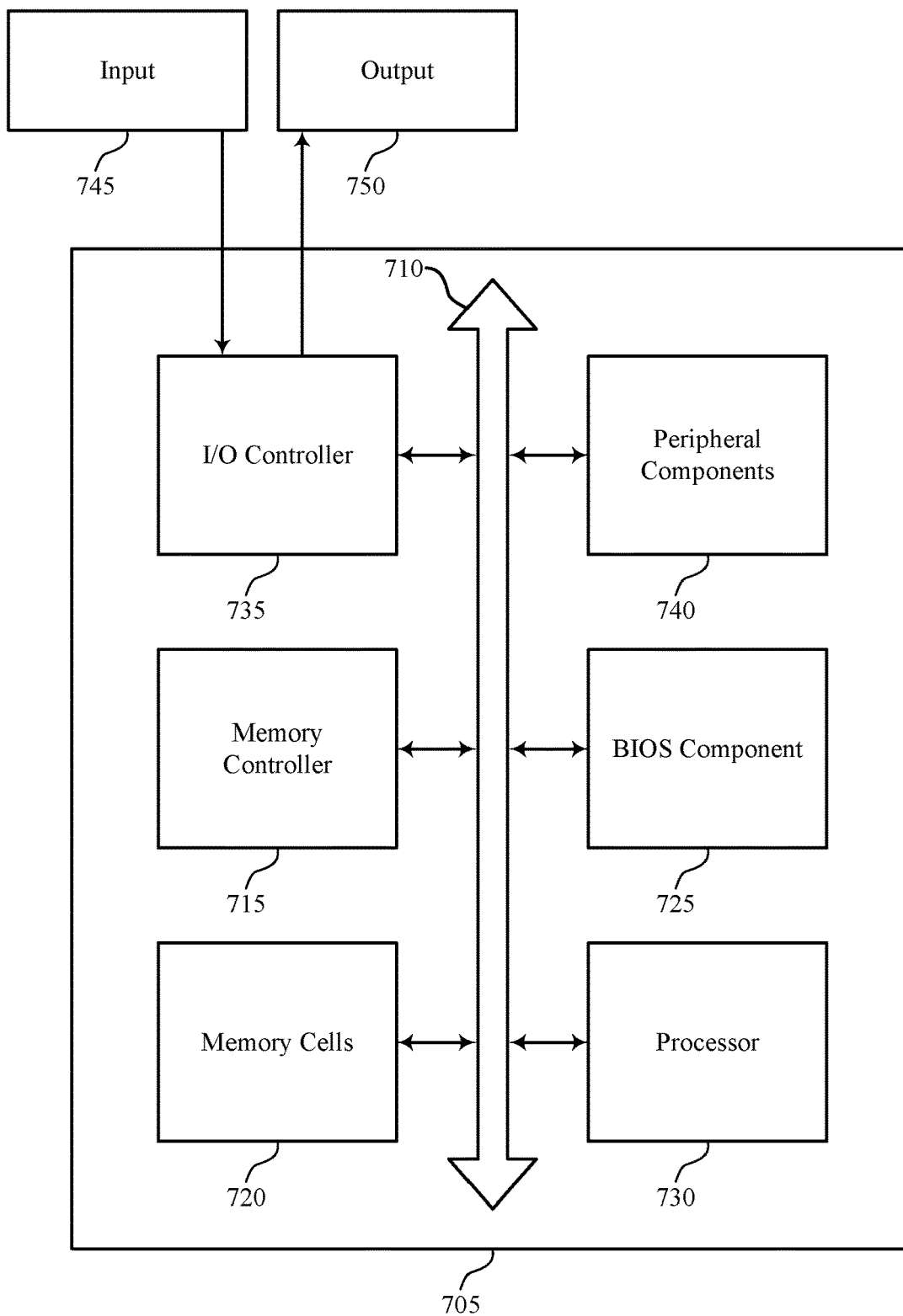
FIG. 7 illustrates a block diagram of a system including a memory array that supports polarity-conditioned memory cell write operations in accordance with examples of the present disclosure.

FIG. 7 shows a diagram of a system 700 including a device 705 that supports polarity-conditioned memory cell write operations in accordance with examples of the present disclosure. Device 705 may be an example of or include components of memory array 100 or 200 as described above, e.g., with reference to FIGS. 1 and 2. Device 705 may include components for bi-directional voice and data communications including components for transmitting and receiving communications, including memory controller 715, memory cells 720, basic input/output system (BIOS) component 725, processor 730, I/O controller 735, and peripheral components 740. These components may be in electronic communication via one or more buses (e.g., bus 710).

Memory controller 715 may operate one or more memory cells as described herein. Specifically, memory controller 715 may be configured to support drift mitigation with embedded refresh. In some cases, memory controller 715 may include a row decoder, column decoder, or both, as described herein (not shown).

Memory cells 720 may store information (i.e., in the form of a logical state stored by respective ones of the memory cells 720) as described herein. The memory cells 720 may include various memory types or technologies. In some examples, the memory cells 720 may include DRAM or FeRAM architectures. In some examples, the memory cells 720 may include PCM architectures. In some examples, the memory cells 720 may include SSM architectures.

BIOS component 725 be a software component that includes BIOS operated as firmware, which may initialize and run various hardware components. BIOS component 725 may also manage data flow between a processor and various other components, e.g., peripheral components, input/output control component, etc. BIOS component 725 may include a program or software stored in read only memory (ROM), flash memory, or any other non-volatile memory.

Processor 730 may include an intelligent hardware device, (e.g., a general-purpose processor, a DSP, a central processing unit (CPU), a microcontroller, an ASIC, an FPGA, a programmable logic device, a discrete gate or transistor logic component, a discrete hardware component, or any combination thereof). In some cases, processor 730 may be configured to operate a memory array using a memory controller. In other cases, a memory controller may be integrated into processor 730. Processor 730 may be configured to execute computer-readable instructions stored in a memory to perform various functions (e.g., functions or tasks supporting drift mitigation with embedded refresh).

I/O controller 735 may manage input and output signals for device 705. I/O controller 735 may also manage peripherals not integrated into device 705. In some cases, I/O controller 735 may represent a physical connection or port to an external peripheral. In some cases, I/O controller 735 may utilize an operating system such as iOS®, ANDROID®, MS-DOS®, MS-WINDOWS®, OS/2®, UNIX®, LINUX®, or another known operating system.

In other cases, I/O controller 735 may represent or interact with a modem, a keyboard, a mouse, a touchscreen, or a similar device. In some cases, I/O controller 735 may be implemented as part of a processor. In some cases, a user may interact with device 705 via I/O controller 735 or via hardware components controlled by I/O controller 735.

Peripheral components 740 may include any input or output device, or an interface for such devices. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots.

Input 745 may represent a device or signal external to device 705 that provides input to device 705 or its components. This may include a user interface or an interface with or between other devices. In some cases, input 745 may be managed by I/O controller 735, and may interact with device 705 via a peripheral component 740.

Output 750 may also represent a device or signal external to device 705 configured to receive output from device 705 or any of its components. Examples of output 750 may include a display, audio speakers, a printing device, another processor or printed circuit board, etc. In some cases, output 750 may be a peripheral element that interfaces with device 705 via peripheral component(s) 740. In some cases, output 750 may be managed by I/O controller 735.

The components of device 705 may include circuitry designed to carry out their functions. This may include various circuit elements, for example, conductive lines, transistors, capacitors, inductors, resistors, amplifiers, or other active or inactive elements, configured to carry out the functions described herein. Device 705 may be a computer, a server, a laptop computer, a notebook computer, a tablet computer, a mobile phone, a wearable electronic device, a personal electronic device, or the like. Or device 705 may be a portion or aspect of such a device.

Figure 8:
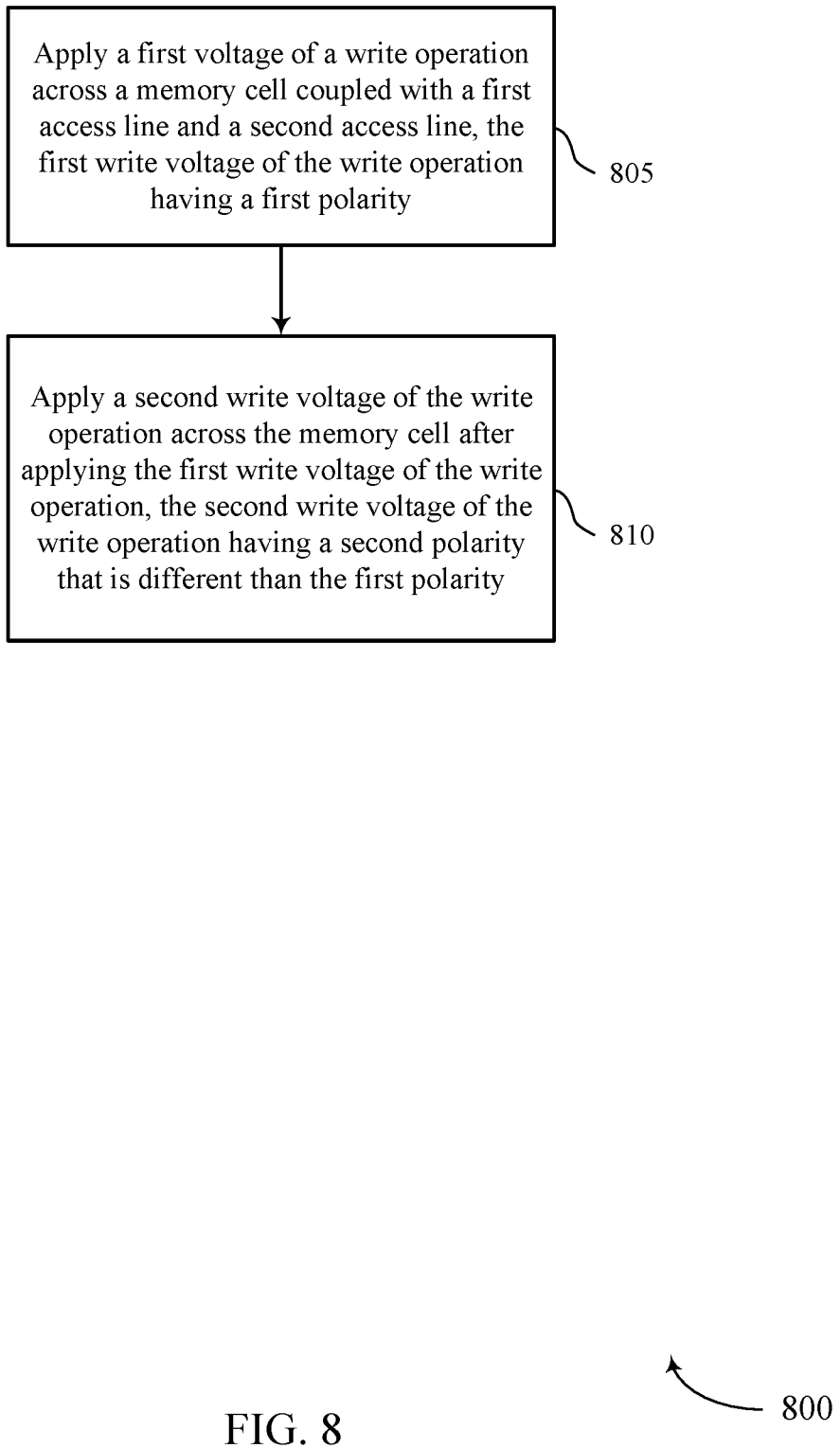
FIGS. 8 through 12 illustrate methods for polarity-conditioned memory cell write operations in accordance with examples of the present disclosure.

FIG. 8 shows a flowchart illustrating a method 800 for polarity-conditioned write operations in accordance with examples of the present disclosure. The operations of method 800 may be implemented or facilitated by a memory controller or its components as described herein. For example, the operations of method 800 may be performed by a memory controller as described with reference to FIGS. 1 through 7. In some examples, a memory controller may execute a set of instructions to control the functional elements of the device to perform the functions described herein (e.g., activating access lines in communication with a target memory cell, enabling or controlling voltage sources, coupling voltage sources to access lines in communication with a target memory cell 105, communicating with a sense component, etc.). Additionally or alternatively, the memory controller may perform aspects of the functions described below using special-purpose hardware. In some cases, the memory cell comprises a chalcogenide material.

At 805 the memory controller may apply a first voltage of a write operation across a memory cell coupled with a first access line and a second access line, the first write voltage of the write operation having a first polarity. The operations of 805 may be performed according to the methods described herein. In certain examples, aspects of the operations of 805 may be performed by an application component, another component, or a memory controller, as described with reference to FIGS. 5 through 7.

At 810 the memory controller may apply a second write voltage of the write operation across the memory cell after applying the first write voltage of the write operation, the second write voltage of the write operation having a second polarity that is different than the first polarity. The operations of 810 may be performed according to the methods described herein. In certain examples, aspects of the operations of 810 may be performed by an application component, another component, or a memory controller, as described with reference to FIGS. 5 through 7.

In some cases, applying the first write voltage of the write operation is associated with forming an amorphous phase of a phase change material of the memory cell, and applying the second write voltage of the write operation is associated with forming a crystalline phase of the phase change material of the memory cell. In some cases, applying the first write voltage of the write operation is associated with current flowing through the memory cell in a first direction, and applying the second write voltage is associated with current flowing through the memory cell in a second direction that is different from the first direction. In various examples, applying the first write voltage or the second write voltage of the write operation includes applying a step change in voltage across the memory cell or applying a ramped change in voltage across the memory cell.

Figure 9:
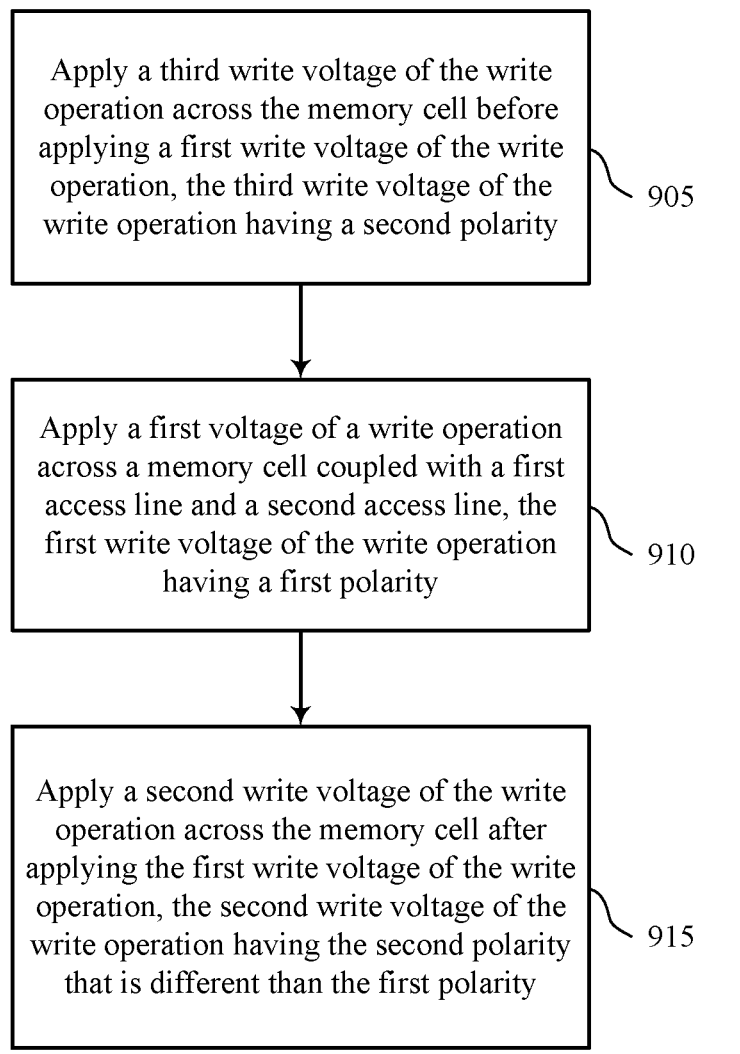

FIG. 9 shows a flowchart illustrating a method 900 for polarity-conditioned memory cell write operations in accordance with embodiments of the present disclosure. The operations of method 900 may be implemented or facilitated by a memory controller or its components as described herein. For example, the operations of method 900 may be performed by a memory controller as described with reference to FIGS. 1 through 7. In some examples, a memory controller may execute a set of instructions to control the functional elements of the device to perform the functions described herein (e.g., activating access lines in communication with a target memory cell, enabling or controlling voltage sources, coupling voltage sources to access lines in communication with a target memory cell 105, communicating with a sense component, etc.). Additionally or alternatively, the memory controller may perform aspects of the functions described below using special-purpose hardware. In some cases, the memory cell comprises a chalcogenide material.

At 905 the memory controller may apply a third write voltage of a write operation across the memory cell before applying a first write voltage of the write operation, the third write voltage of the write operation having a second polarity. The operations of 905 may be performed according to the methods described herein. In certain examples, aspects of the operations of 905 may be performed by an application component, another component, or a memory controller, as described with reference to FIGS. 5 through 7.

At 910 the memory controller may apply the first voltage of the write operation across a memory cell coupled with a first access line and a second access line, the first write voltage of the write operation having a first polarity. The operations of 910 may be performed according to the methods described herein. In certain examples, aspects of the operations of 910 may be performed by an application component, another component, or a memory controller, as described with reference to FIGS. 5 through 7.

At 915 the memory controller may apply a second write voltage of the write operation across the memory cell after applying the first write voltage of the write operation, the second write voltage of the write operation having the second polarity that is different than the first polarity. The operations of 915 may be performed according to the methods described herein. In certain examples, aspects of the operations of 915 may be performed by an application component, another component, or a memory controller, as described with reference to FIGS. 5 through 7.

Figure 10:
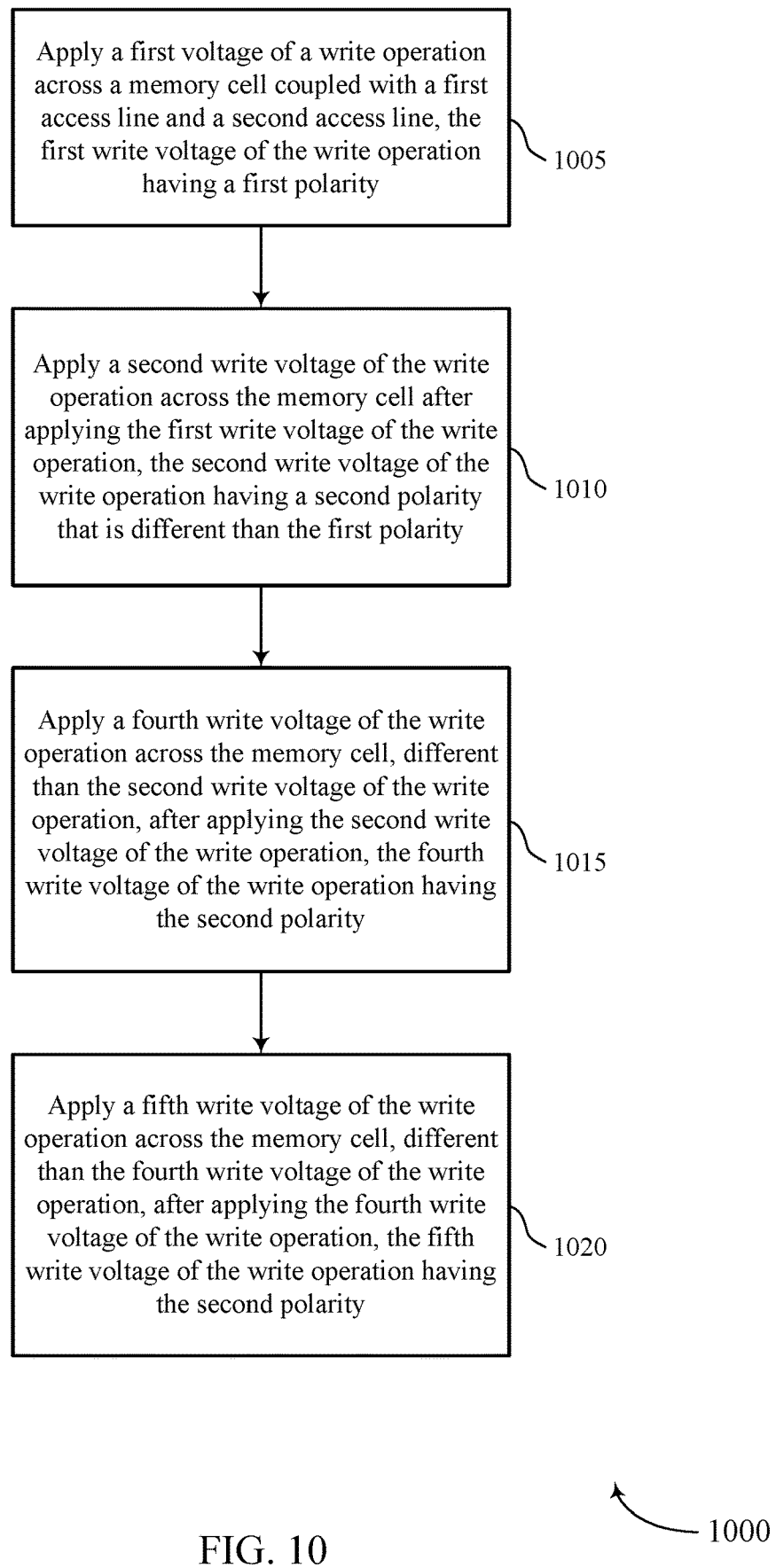

FIG. 10 shows a flowchart illustrating a method 1000 for polarity-conditioned memory cell write operations in accordance with embodiments of the present disclosure. The operations of method 1000 may be implemented or facilitated by a memory controller or its components as described herein. For example, the operations of method 1000 may be performed by a memory controller as described with reference to FIGS. 1 through 7. In some examples, a memory controller may execute a set of instructions to control the functional elements of the device to perform the functions described herein (e.g., activating access lines in communication with a target memory cell, enabling or controlling voltage sources, coupling voltage sources to access lines in communication with a target memory cell 105, communicating with a sense component, etc.). Additionally or alternatively, the memory controller may perform aspects of the functions described below using special-purpose hardware. In some cases, the memory cell comprises a chalcogenide material.

At 1005 the memory controller may apply a first voltage of a write operation across a memory cell coupled with a first access line and a second access line, the first write voltage of the write operation having a first polarity. The operations of 1005 may be performed according to the methods described herein. In certain examples, aspects of the operations of 1005 may be performed by an application component, another component, or a memory controller, as described with reference to FIGS. 5 through 7.

At 1010 the memory controller may apply a second write voltage of the write operation across the memory cell after applying the first write voltage of the write operation, the second write voltage of the write operation having a second polarity that is different than the first polarity. In some examples, the second write voltage is associated with a nucleation of a crystalline phase of a phase change memory material of the memory cell The operations of 1010 may be performed according to the methods described herein. In certain examples, aspects of the operations of 1010 may be performed by an application component, another component, or a memory controller, as described with reference to FIGS. 5 through 7.

In some examples, the memory controller may also apply a third write voltage of the write operation across the memory cell before applying a first write voltage of the write operation, the third write voltage of the write operation having a second polarity.

At 1015 the memory controller may apply a fourth write voltage of the write operation across the memory cell, different than the second write voltage of the write operation, after applying the second write voltage of the write operation, the fourth write voltage of the write operation having the second polarity. In some examples, the fourth write voltage is associated with a growth of a crystalline phase of a phase change memory material of the memory cell The operations of 1015 may be performed according to the methods described herein. In certain examples, aspects of the operations of 1015 may be performed by an application component, another component, or a memory controller, as described with reference to FIGS. 5 through 7.

At 1020 the memory controller may apply a fifth write voltage of the write operation across the memory cell, different than the fourth write voltage of the write operation, after applying the fourth write voltage of the write operation, the fifth write voltage of the write operation having the second polarity. In some examples, the fifth write voltage is associated with a setback of a crystalline phase of a phase change memory material of the memory cell. The operations of 1020 may be performed according to the methods described herein. In certain examples, aspects of the operations of 1020 may be performed by an application component, another component, or a memory controller, as described with reference to FIGS. 5 through 7.

Figure 11:
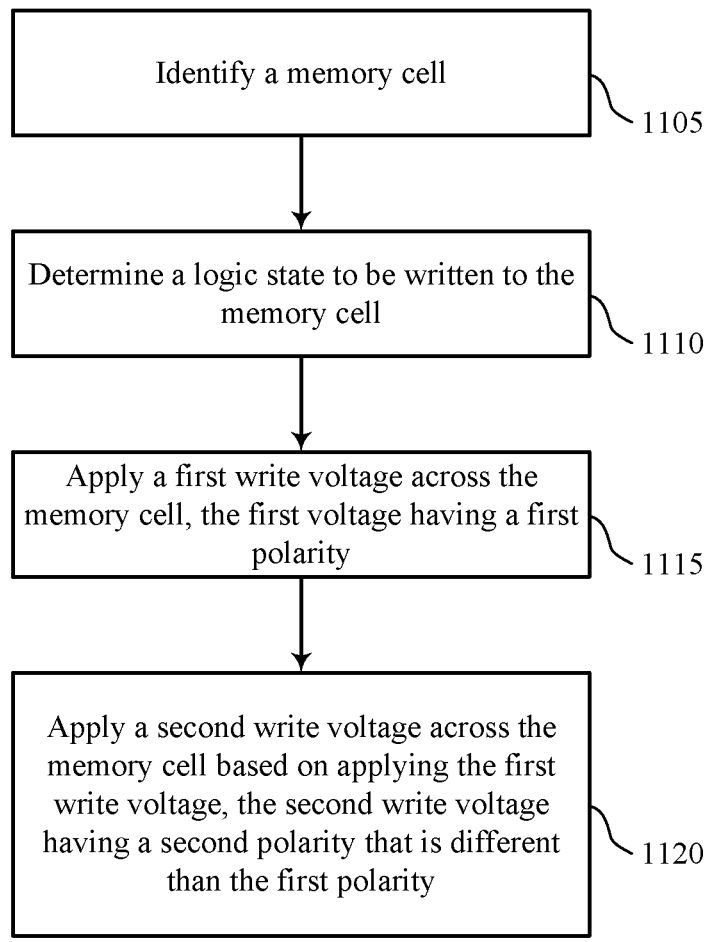

FIG. 11 shows a flowchart illustrating a method 1100 for polarity-conditioned memory cell write operations in accordance with embodiments of the present disclosure. The operations of method 1100 may be implemented or facilitated by a memory controller or its components as described herein. For example, the operations of method 1100 may be performed by a memory controller as described with reference to FIGS. 1 through 7. In some examples, a memory controller may execute a set of instructions to control the functional elements of the device to perform the functions described herein (e.g., activating access lines in communication with a target memory cell, enabling or controlling voltage sources, coupling voltage sources to access lines in communication with a target memory cell 105, communicating with a sense component, etc.). Additionally or alternatively, the memory controller may perform aspects of the functions described below using special-purpose hardware. In some cases, the memory cell comprises a chalcogenide material.

At 1105 the memory controller may identify a memory cell. The operations of 1105 may be performed according to the methods described herein. In certain examples, aspects of the operations of 1105 may be performed by a determination component as described with reference to FIGS. 5 through 7.

At 1110 the memory controller may determine a logic state to be written to the memory cell. The operations of 1110 may be performed according to the methods described herein. In certain examples, aspects of the operations of 1110 may be performed by an application component, another component, or a memory controller, as described with reference to FIGS. 5 through 7. After determining the logic state to be written to the memory cell, the method 1100 may include writing the logic state to the memory cell using a write operation (e.g., as described with reference to 1115 and 1120).

At 1115 the memory controller may apply a first write voltage across the memory cell, the first voltage having a first polarity. In some cases, applying the first write voltage is associated with forming a first material phase of a portion of the memory cell. The operations of 1115 may be performed according to the methods described herein. In certain examples, aspects of the operations of 1115 may be performed by an application component, another component, or a memory controller, as described with reference to FIGS. 5 through 7.

At 1120 the memory controller may apply a second write voltage across the memory cell based at least in part on applying the first write voltage, the second write voltage having a second polarity that is different than the first polarity. In some cases, applying the second write voltage is associated with forming a second material phase of the portion of the memory cell. The operations of 1120 may be performed according to the methods described herein. In certain examples, aspects of the operations of 1120 may be performed by an application component, another component, or a memory controller, as described with reference to FIGS. 5 through 7.

Figure 12:
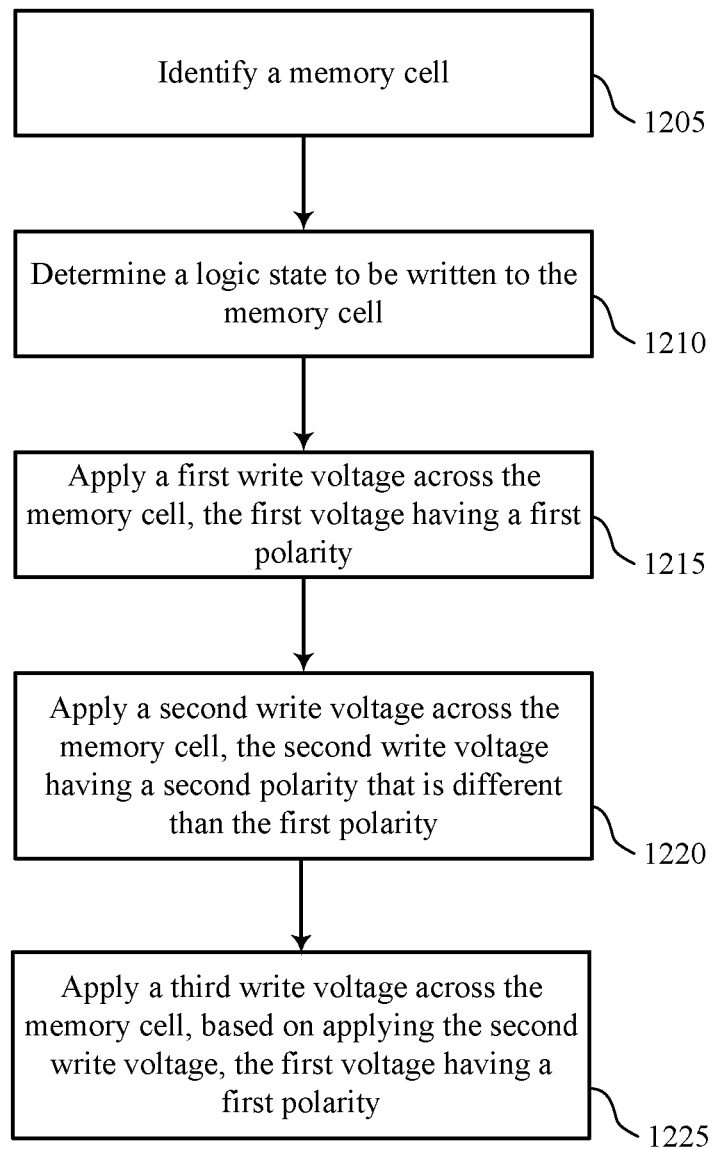

FIG. 12 shows a flowchart illustrating a method 1200 for polarity-conditioned memory cell write operations in accordance with embodiments of the present disclosure. The operations of method 1200 may be implemented or facilitated by a memory controller or its components as described herein. For example, the operations of method 1200 may be performed by a memory controller as described with reference to FIGS. 1 through 7. In some examples, a memory controller may execute a set of instructions to control the functional elements of the device to perform the functions described herein (e.g., activating access lines in communication with a target memory cell, enabling or controlling voltage sources, coupling voltage sources to access lines in communication with a target memory cell 105, communicating with a sense component, etc.). Additionally or alternatively, the memory controller may perform aspects of the functions described below using special-purpose hardware. In some cases, the memory cell comprises a chalcogenide material.

In some cases, the method may also include identifying a memory cell. In some cases, the method may also include determining a logic state to be written to the memory cell. In some cases, the method may also include applying a first write voltage across the memory cell, the first voltage having a first polarity. In some cases, the method may also include applying a second write voltage across the memory cell based at least in part on applying the first write voltage, the second write voltage having a second polarity that is different than the first polarity. In some cases, the write operation further comprises: applying a third write voltage across the memory cell before applying the first write voltage, the third write voltage having the second polarity.

At 1205 the memory controller may identify a memory cell. The operations of 1205 may be performed according to the methods described herein. In certain examples, aspects of the operations of 1205 may be performed by a determination component as described with reference to FIGS. 5 through 7.

At 1210 the memory controller may determine a logic state to be written to the memory cell. The operations of 1210 may be performed according to the methods described herein. In certain examples, aspects of the operations of 1210 may be performed by an application component, another component, or a memory controller, as described with reference to FIGS. 5 through 7. After determining the logic state to be written to the memory cell, the method 1200 may include writing the logic state to the memory cell using a write operation (e.g., as described with reference to 1215, 1220, and 1225).

At 1215 the memory controller may apply a first write voltage across the memory cell, the first voltage having a first polarity. In some examples, applying the first write voltage is associated with forming a first phase of a portion of the memory cell. The operations of 1215 may be performed according to the methods described herein. In certain examples, aspects of the operations of 1215 may be performed by an application component, another component, or a memory controller, as described with reference to FIGS. 5 through 7.

At 1220 the memory controller may apply a second write voltage across the memory cell, the second write voltage having a second polarity that is different than the first polarity. In some examples, applying the second write voltage is associated with forming a second phase of the portion of the memory cell. The operations of 1220 may be performed according to the methods described herein. In certain examples, aspects of the operations of 1220 may be performed by an application component, another component, or a memory controller, as described with reference to FIGS. 5 through 7.

At 1225 the memory controller may apply a third write voltage across the memory cell based at least in part on applying the second write voltage, the third write voltage having the first polarity. In some examples, applying the first third write voltage is associated with forming the second phase of the portion of the memory cell. The operations of 1225 may be performed according to the methods described herein. In certain examples, aspects of the operations of 1225 may be performed by an application component, another component, or a memory controller, as described with reference to FIGS. 5 through 7.

It should be noted that the methods described above describe possible implementations, and that the operations and the steps may be rearranged or otherwise modified and that other implementations are possible. Further, examples from two or more of the methods may be combined.

The description herein provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. Also, features described with respect to some examples may be combined in other examples.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V), or more generally represents a reference voltage of the electrical circuit or device including the electrical circuit, which may or may not be directly coupled with ground. Accordingly, the voltage of a virtual ground may temporarily fluctuate and return to approximately 0V, or virtual 0V, at steady state. A virtual ground may be implemented using various electronic circuit elements, such as a voltage divider consisting of operational amplifiers and resistors. Other implementations are also possible. "Virtual grounding" or "virtually grounded" means connected to approximately 0V, or some other reference voltage of a device.

The term "electronic communication" and "coupled" refers to a relationship between components that supports electron flow between the components. This may include a direct connection or coupling between components or may include intermediate components. In other words, components that are "connected with" or "coupled with" are in electronic communication with each other. Components in electronic communication may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected or coupled via a switch (e.g., a transistor) are in electronic communication regardless of the state of the switch (i.e., open or closed).

The term "isolated" refers to a relationship between components in which electrons are not presently capable of flowing between them; components are isolated from each other if there is an open circuit between them. For example, two components physically coupled by a switch may be isolated from each other when the switch is open.

As used herein, the term "shorting" refers to a relationship between components in which a conductive path is established between the components via the activation of a single intermediary component between the two components in question. For example, a first component shorted to a second component may exchange electrons with the second component when a switch between the two components is closed. Thus, shorting may be a dynamic operation that enables the application of voltage and/or flow of charge between components (or lines) that are in electronic communication.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 100.

As used herein, the term "terminal" need not suggest a physical boundary or connection point of a circuit element. Rather, "terminal" may refer to a reference point of a circuit relevant to the circuit element, which may also be referred to as a "node" or "reference point."

The term "layer" used herein refers to a stratum or sheet of a geometrical structure. each layer may have three dimensions (e.g., height, width, and depth) and may cover some or all of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

Chalcogenide materials may be materials or alloys that include at least one of the elements S, Se, and Te. Phase change materials discussed herein may be chalcogenide materials. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Examples are not limited to a particular variable resistance material or materials associated with the memory elements of the memory cells. For example, other examples of variable resistance materials can be used to form memory elements and may include chalcogenide materials, colossal magnetoresistive materials, or polymer-based materials, among others.

The devices discussed herein, including memory arrays 100 and 200 described with reference to FIGS. 1 and 2, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C).

As used herein, the term "substantially" means that the modified characteristic (e.g., a verb or adjective modified by the term substantially) need not be absolute but is close enough so as to achieve the advantages of the characteristic.

As used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method comprising:
    applying a first voltage of a write operation across a memory cell to form an unstable atomic distribution of a phase change material of the memory cell, the first voltage of the write operation having a first polarity;
    applying a second voltage of the write operation across the memory cell, after applying the first voltage of the write operation, to form a stable atomic distribution of the phase change material of the memory cell, the second voltage of the write operation having a second polarity that is different than the first polarity; and applying a third voltage of the write operation across the memory cell, after applying the second voltage of the write operation, to form the stable atomic distribution of the phase change material of the memory cell, the third voltage of the write operation having the first polarity, wherein the third voltage of the write operation has a higher magnitude than the second voltage of the write operation.

2. The method of claim 1, wherein the unstable atomic distribution comprises an unstable amorphous phase of the phase change material of the memory cell.

3. The method of claim 1, wherein the stable atomic distribution comprises a stable crystalline phase of the phase change material of the memory cell.

4. The method of claim 1, wherein applying the second voltage of the write operation is configured for a nucleation of a crystalline phase of the phase change material of the memory cell, and applying the third voltage of the write operation is configured for a growth of the crystalline phase of the phase change material of the memory cell.

5. The method of claim 1, further comprising:
applying a fourth voltage of the write operation across the memory cell, after applying the third voltage of the write operation, the fourth voltage of the write operation having the second polarity.

6. The method of claim 5, wherein applying the fourth voltage of the write operation is configured for a setback of a crystalline phase of a phase change memory material of the memory cell.

7. The method of claim 1, wherein the first polarity is opposite from the second polarity.

8. A memory device, comprising:
a memory cell;
a first access line coupled with the memory cell;
a second access line coupled with the memory cell; and
a memory controller coupled with the first access line and the second access line, the memory controller operable to:
apply a first voltage of a write operation across the memory cell, the first voltage of the write operation having a first polarity and configured to form an unstable atomic distribution of the memory cell; and
apply a second voltage of the write operation across the memory cell, after applying the first voltage of the write operation, the second voltage of the write operation having a second polarity that is different than the first polarity and configured to form a stable atomic distribution of the memory cell; and
apply a third voltage of the write operation across the memory cell after applying the second voltage of the write operation, the third voltage of the write operation having the first polarity, wherein the third voltage of the write operation has a higher magnitude than the second voltage of the write operation.

9. The memory device of claim 8, wherein applying the first voltage is configured for a first amount of ohmic heating of the memory cell and applying the second voltage is configured for a second amount of ohmic heating of the memory cell that is less than the first amount.

10. The memory device of claim 8, wherein the memory cell comprises a chalcogenide material.

11. A method comprising:
identifying a memory cell;
determining a logic state to be written to the memory cell;
writing the logic state to the memory cell as part of a write operation that comprises:
applying a first voltage across the memory cell to form an unstable state of a chalcogenide material of the memory cell, the first voltage having a first polarity; and
applying a second voltage across the memory cell, based at least in part on applying the first voltage, to form a stable state of the chalcogenide material of the memory cell, the second voltage having a second polarity that is different than the first polarity;
determining to write a second logic state to the memory cell using a second write operation based at least in part on writing the logic state to the memory cell using the write operation; and
writing the second logic state to the memory cell as part of a second write operation that comprises:
applying a third voltage across the memory cell to form the unstable state of the chalcogenide material of the memory cell, the third voltage having the second polarity; and
applying a fourth voltage across the memory cell, based at least in part on applying the third voltage, to form the stable state of the chalcogenide material of the memory cell, the fourth voltage having the first polarity.

12. The method of claim 11, further comprising:
determining to read the memory cell; and
reading the memory cell using a read operation that comprises:
applying a read voltage across the memory cell, the read voltage having a polarity that is based at least in part on the first polarity or the second polarity.

13. The method of claim 11, wherein the second logic state is different than the logic state.

14. The method of claim 11, wherein applying the first voltage of the write operation is configured to form a first material phase of a portion of the memory cell, and applying the second voltage of the write operation is configured to form a second material phase of the portion of the memory cell.

15. The memory device of claim 8, wherein the unstable atomic distribution comprises an unstable amorphous phase of a phase change material of the memory cell, and the stable atomic distribution comprises a stable crystalline phase of the phase change material of the memory cell.

16. The memory device of claim 8, wherein applying the second voltage of the write operation is configured for a nucleation of a crystalline phase of a phase change material of the memory cell, and applying the third voltage of the write operation is configured for a growth of the crystalline phase of the phase change material of the memory cell.

17. The memory device of claim 8, wherein the memory controller is operable to:
apply a fourth voltage of the write operation across the memory cell, after applying the third voltage of the write operation, the fourth voltage of the write operation having the second polarity.

18. The memory device of claim 17, wherein applying the fourth voltage of the write operation is configured for a setback of a crystalline phase of a phase change memory material of the memory cell.

19. The method of claim 11, wherein applying the first voltage is configured for a first amount of ohmic heating of the memory cell and applying the second voltage is configured for a second amount of ohmic heating of the memory cell that is less than the first amount.

20. The method of claim 11, wherein the unstable state comprises an unstable amorphous phase of the chalcogenide material of the memory cell, and the stable state comprises a stable crystalline phase of the chalcogenide material of the memory cell.

* * * * *